United States Patent
Pillai et al.

(10) Patent No.: US 10,445,064 B2
(45) Date of Patent: Oct. 15, 2019

(54) IMPLEMENTING LOGARITHMIC AND ANTILOGARITHMIC OPERATIONS BASED ON PIECEWISE LINEAR APPROXIMATION

(71) Applicant: Intel Corporation, Santa Clara, CA (US)

(72) Inventors: Kamlesh R. Pillai, Gujarat (IN); Gurpreet S. Kalsi, Bangalore (IN)

(73) Assignee: Intel Corporation, Santa Clara, CA (US)

(*) Notice: Subject to any disclaimer, the term of this patent is extended or adjusted under 35 U.S.C. 154(b) by 126 days.

(21) Appl. No.: 15/424,063

(22) Filed: Feb. 3, 2017

(65) Prior Publication Data
US 2018/0225093 A1 Aug. 9, 2018

(51) Int. Cl.
| | |
|---|---|
| G06F 7/483 | (2006.01) |
| G06F 7/556 | (2006.01) |
| H03M 7/24 | (2006.01) |
| G06F 7/499 | (2006.01) |
| G06F 7/552 | (2006.01) |
| H03M 7/30 | (2006.01) |
| G06F 7/523 | (2006.01) |
| G06F 1/03 | (2006.01) |

(52) U.S. Cl.
CPC .......... *G06F 7/4833* (2013.01); *G06F 1/0307* (2013.01); *G06F 7/49915* (2013.01); *G06F 7/5235* (2013.01); *G06F 7/556* (2013.01); *G06F 7/5525* (2013.01); *H03M 7/24* (2013.01); *H03M 7/3064* (2013.01); *G06F 7/483* (2013.01); *G06F 2207/3884* (2013.01)

(58) Field of Classification Search
CPC .............................. G06F 7/556; G06F 2101/10
USPC .......................................................... 708/606
See application file for complete search history.

(56) References Cited

PUBLICATIONS

F. Sheikh, et al, A 2.05 GVertices/s 151 mW Lighting Accelerator for 3D Graphics Vertex and Pixel Shading in 32 nm CMOS, IEEE Journal of Solid-State Circuits, vol. 48, No. 1, Jan. 2013 (Year: 2013).*
M. Zhu, et al., Error Flatten Logarithm Approximation for Graphics Processing Unit, IEEE, 2011. (Year: 2011).*
J.Y.L. Low, et al, Unified Mitchell-Based Approximation for Efficient Logarithmic Conversion Circuit, IEEE Transactions on Computers, vol. 64, No. 6, pp. 1783-1797, 2015. (Year: 2015).*
B. Lee, et al., Logarithmic Number System and Floating-point Implementations of a Well-conditioned RLS Estimation Algorithm on FPGA, IEEE, pp. 109-113, 2003 (Year: 2003).*

* cited by examiner

*Primary Examiner* — Andrew Caldwell
*Assistant Examiner* — Emily E Larocque
(74) *Attorney, Agent, or Firm* — Lowenstein Sandler LLP

(57) ABSTRACT

Implementations of the disclosure provide logarithm and anti-logarithm operations on a hardware processor based on linear piecewise approximation. An example processor includes a piece wise linear log approximation circuit that receives an input of a floating-point number comprising a sign, an exponent and a mantissa. The piece wise linear log approximation circuit approximates a fractional portion of a fixed point number using a linear approximation of the mantissa of the floating-point number. The piece wise linear log approximation circuit also derives an integer from the exponent.

20 Claims, 23 Drawing Sheets

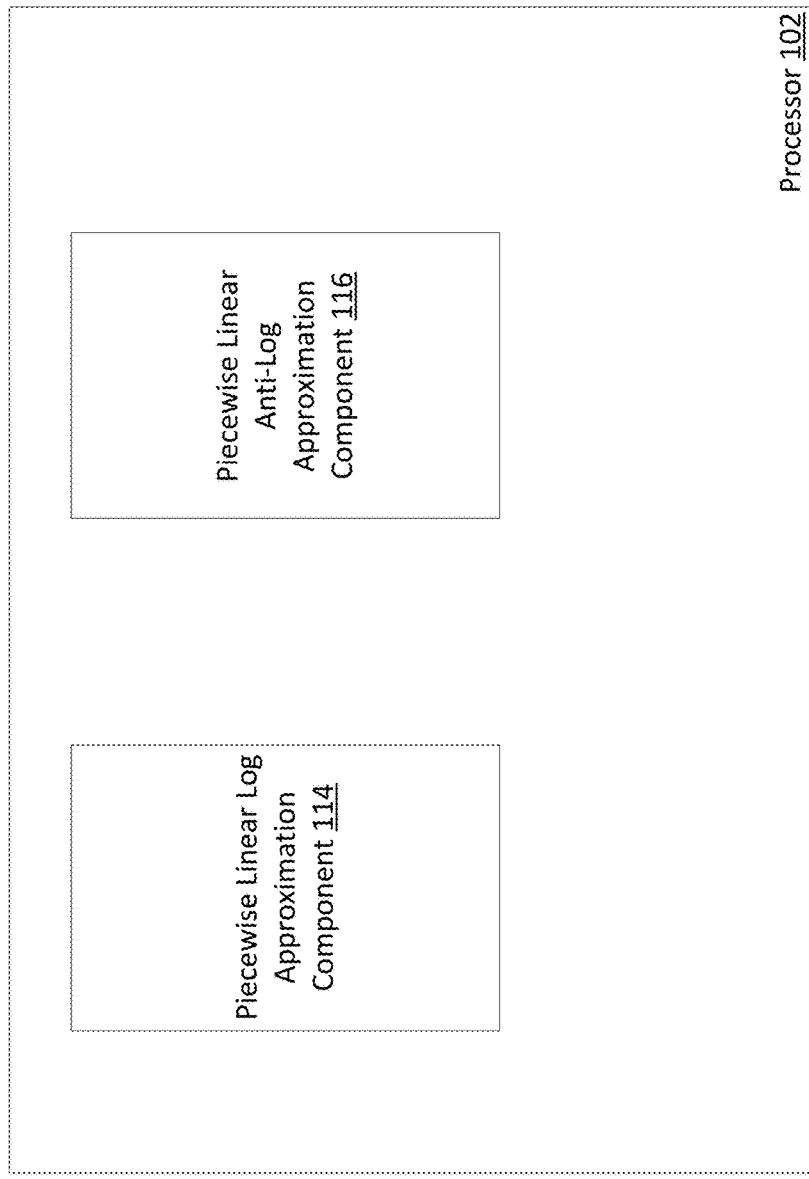

$$\log_2(1+m) = \begin{cases} m + \frac{3m}{8} + \frac{1}{64} & 0 \le m < 0.125 \\ m + \frac{m}{4} + \frac{1}{16} & 0.125 \le m < 0.25 \\ m + \frac{m}{16} + \frac{1}{8} & 0.25 \le m < 0.5 \\ m - \frac{m}{8} + \frac{1}{32} & 0.5 \le m < 0.75 \\ m - \frac{m}{4} + \frac{1}{4} & 0.75 \le m < 1 \end{cases}$$

Fig. 2A $$\text{Log}_2(1+m) = \begin{cases} m + \dfrac{m}{4} + \dfrac{m}{8} + \dfrac{m}{64} & 0 \leq m < 0.0625 \\[6pt] m + \dfrac{m}{4} + \dfrac{m}{16} + \dfrac{1}{256} + \dfrac{1}{1024} & 0.0625 \leq m < 0.125 \\[6pt] m + \dfrac{m}{4} + \dfrac{1}{64} - \dfrac{1}{512} & 0.125 \leq m < 0.1875 \\[6pt] m + \dfrac{m}{8} + \dfrac{m}{16} + \dfrac{1}{64} + \dfrac{1}{128} & 0.1875 \leq m < 0.25 \\[6pt] m + \dfrac{m}{8} + \dfrac{1}{32} + \dfrac{1}{128} & 0.25 \leq m < 0.3125 \\[6pt] m + \dfrac{m}{16} + \dfrac{m}{128} + \dfrac{1}{16} & 0.3125 \leq m < 0.375 \\[6pt] m + \dfrac{m}{64} + \dfrac{m}{128} + \dfrac{1}{16} + \dfrac{1}{128} & 0.375 \leq m < 0.4375 \\[6pt] m - \dfrac{m}{64} + \dfrac{1}{16} + \dfrac{1}{32} & 0.4375 \leq m < 0.5 \\[6pt] m - \dfrac{m}{16} + \dfrac{m}{128} + \dfrac{1}{8} & 0.5 \leq m < 0.5625 \\[6pt] m - \dfrac{m}{8} + \dfrac{m}{32} + \dfrac{1}{8} + \dfrac{1}{128} & 0.5625 \leq m < 0.625 \\[6pt] m - \dfrac{m}{8} + \dfrac{1}{8} + \dfrac{1}{32} & 0.625 \leq m < 0.6875 \\[6pt] m - \dfrac{m}{8} - \dfrac{m}{32} + \dfrac{1}{8} + \dfrac{1}{16} & 0.6875 \leq m < 0.75 \\[6pt] m - \dfrac{m}{4} + \dfrac{m}{16} + \dfrac{1}{8} + \dfrac{1}{16} & 0.75 \leq m < 0.8125 \\[6pt] m - \dfrac{m}{4} + \dfrac{m}{32} + \dfrac{1}{4} & 0.8125 \leq m < 0.875 \\[6pt] m - \dfrac{m}{4} + \dfrac{1}{4} & 0.875 \leq m < 0.9375 \\[6pt] m - \dfrac{m}{4} - \dfrac{m}{64} + \dfrac{1}{4} + \dfrac{1}{64} & 0.9375 \leq m < 1 \end{cases}$$

203

201

FIG. 2B $$2^{z+\eta} = 2^z \times 2^\eta, e = Z + 0 \times 7F, 1 + m = 2^\eta$$

$$2^\eta = \begin{cases} 1 + \eta - \dfrac{1}{4}\eta & \underline{404} & 0 \le \eta \le 0.25 & \underline{405} \\[6pt] 1 + \eta - \dfrac{1}{32} & \underline{406} & 0.25 \le \eta \le 0.5 & \underline{407} \\[6pt] 1 + \eta - \dfrac{1}{16}\eta - \dfrac{1}{8} & \underline{408} & 0.5 \le \eta \le 0.75 & \underline{409} \\[6pt] 1 + \eta + \dfrac{5}{16}\eta - \dfrac{5}{16} & \underline{410} & 0.75 \le \eta \le 1.0 & \underline{411} \end{cases}$$

403  $2^\eta =$ 
$$\begin{cases}
\eta - \frac{\eta}{4} - \frac{\eta}{32} + 1 & 0 \le \eta < 0.0625 \\
\eta - \frac{\eta}{4} - \frac{\eta}{64} + 1 - \frac{1}{512} & 0.0625 \le \eta < 0.125 \\
\eta - \frac{\eta}{4} + \frac{\eta}{32} + 1 - \frac{1}{128} & 0.125 \le \eta < 0.1875 \\
\eta - \frac{\eta}{8} - \frac{\eta}{16} + 1 - \frac{1}{64} & 0.1875 \le \eta < 0.25 \\
\eta - \frac{\eta}{8} - \frac{\eta}{32} + 1 - \frac{1}{32} + \frac{1}{128} & 0.25 \le \eta < 0.3125 \\
\eta - \frac{\eta}{8} + 1 - \frac{1}{32} & 0.3125 \le \eta < 0.375 \\
\eta - \frac{\eta}{16} - \frac{\eta}{64} + 1 - \frac{1}{32} - \frac{1}{64} & 0.375 \le \eta < 0.4375 \\
\eta - \frac{\eta}{32} - \frac{\eta}{64} + 1 - \frac{1}{16} & 0.4375 \le \eta < 0.5 \\
\eta + \frac{\eta}{512} + 1 - \frac{1}{8} + \frac{1}{32} & 0.5 \le \eta < 0.5625 \\
\eta + \frac{\eta}{16} - \frac{\eta}{64} + 1 - \frac{1}{8} + \frac{1}{128} & 0.5625 \le \eta < 0.625 \\
\eta + \frac{\eta}{16} + \frac{\eta}{32} + 1 - \frac{1}{8} - \frac{1}{64} & 0.625 \le \eta < 0.6875 \\
\eta + \frac{\eta}{8} + \frac{\eta}{64} + 1 - \frac{1}{4} + \frac{1}{16} & 0.6875 \le \eta < 0.75 \\
\eta + \frac{\eta}{8} + \frac{\eta}{16} + 1 - \frac{1}{4} + \frac{1}{32} & 0.75 \le \eta < 0.8125 \\
\eta + \frac{\eta}{4} - \frac{\eta}{128} + 1 - \frac{1}{4} - \frac{1}{128} & 0.8125 \le \eta < 0.875 \\
\eta + \frac{\eta}{4} + \frac{\eta}{32} + 1 - \frac{1}{4} - \frac{1}{16} & 0.875 \le \eta < 0.9375 \\
\eta + \frac{\eta}{4} + \frac{\eta}{8} + 1 - \frac{1}{4} - \frac{1}{8} & 0.9375 \le \eta < 1
\end{cases}$$

IMPLEMENTING LOGARITHMIC AND ANTILOGARITHMIC OPERATIONS BASED ON PIECEWISE LINEAR APPROXIMATION

TECHNICAL FIELD

The implementations of the disclosure relate generally to a computing device, and, more specifically, relate to implementing logarithm and anti-logarithm operations on a hardware processor based on linear piecewise approximation.

BACKGROUND

Many applications, such as digital signal processing, computer graphics, scientific computing, artificial neural networks, logarithmic number applications, and other media applications, use logarithmic and antilogarithmic computations extensively for rendering data. Logarithm of a number is defined as the exponent to which another fixed value, referred to as the base, is raised to produce that number. It is the inverse operation to exponentiation. The logarithm to base 2 is known as a common logarithm. Antilogarithm is the inverse operation of the logarithm.

BRIEF DESCRIPTION OF THE DRAWINGS

The disclosure will be understood more fully from the detailed description given below and from the accompanying drawings of various implementations of the disclosure. The drawings, however, should not be taken to limit the disclosure to the specific implementations, but are for explanation and understanding.

FIG. 1A illustrates a processor for implementing logarithmic and antilogarithmic operations based on piecewise linear approximation according to an implementation of the disclosure.

FIG. 2A is a chart that illustrates an example of five intervals used to approximate a log function using a piecewise linear equation according to an implementation of the disclosure.

FIG. 2B is a chart that illustrates an example of sixteen intervals used to approximate a log function using a piecewise linear equation according to another implementation of the disclosure.

FIG. 4A is a chart that illustrates an example of four intervals used to approximate an anti-log function using a piecewise linear equation according to an implementation of the disclosure.

FIG. 4B is a chart that illustrates an example of sixteen intervals used to approximate an anti-log function using a piecewise linear equation according to another implementation of the disclosure.

DETAILED DESCRIPTION

Figure 1B:
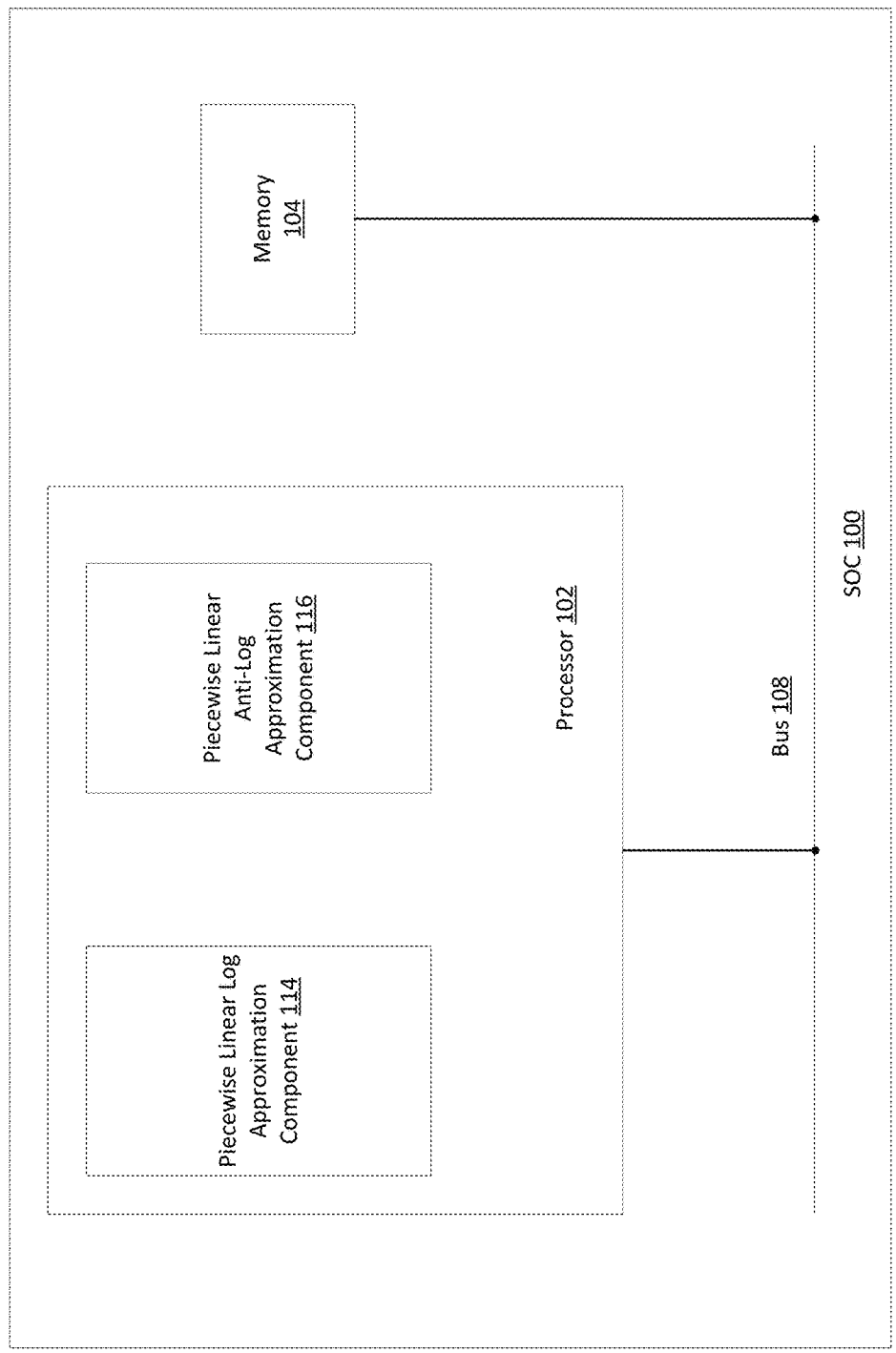
FIG. 1B illustrates a system-on-a-chip (SoC) including a processing system for implementing logarithmic and anti-logarithmic operations based on piecewise linear approximation according to an implementation of the disclosure.

Implementations of the disclosure provide logarithm and anti-logarithm operations on a hardware processor based on linear piecewise approximation. Conventional logarithmic and antilogarithmic computations use a look up table (LUT) for logarithmic (log) and antilogarithmic (antilog) computations, which may take up to 5-8 clock cycles depending on hardware implementations. For example, in conventional systems, a log/antilog parabolic curve is divided into a number of segments and, using a curve-fitting process, the values of coefficients are computed and stored in the memory. In conventional systems, while performing operations on equations, such as $ax^2+bx+c$, for any point on the curve, the values of a, b and c are fetched from a memory, such as a LUT, and calculated using multipliers and adders. LUT and multipliers utilize more area on the hardware processor and typically take up to 5-8 clock cycles to execute each of the operations.

Aspects of the disclosure eliminate the utilization of the LUT and multipliers of conventional systems. In one implementation, a floating-point number is converted into log base 2 equivalent fixed-point number through a log component. The floating-point number may be an exponent to which another fixed value, referred to as the base, is raised to produce the floating-point number. The floating-point number conversion into log domain may be utilized for a variety of complex operations, such as conversion of floating-point multiplication, division and floating-point exponent to fixed-point addition, subtraction, and multiplication, respectively. Furthermore, in implementations of the disclosure, the log base 2 equivalent fixed point number may be converted back into a floating-point number through an anti-log component.

As a LUT and multipliers are not used in the hardware design of implementations of the disclosure, an increase in processing speed with significant area and power savings may be realized over conventional systems. Because of the simplified piecewise liner equations, computation may take a single clock cycle to calculate the log/antilog operation. Hence, the proposed design of implementations of the disclosure is faster than conventional systems, as it provides single clock cycle latency, less area, and less energy as compared to the traditional LUT approach.

FIG. 1A illustrates a processor (such as a central processing unit (CPU)) 102 in accordance with an implementation of the disclosure. The processor 102 may execute tasks, such as system applications and user applications. In one implementation, the processor 102 includes a piecewise linear log approximation component 114, and a piecewise linear anti-log approximation component 116. The piecewise linear log and anti-log approximation components 114 and 116 respectively are circuits, to perform their designated processes, as described below. In one implementation, the circuits are hardware.

The piecewise linear log component 114 computes a log operation, which is an inverse operation to exponentiation. A logarithm of a number may refer to the exponent to which another fixed number, referred to as the base, is raised to produce that number. In one implementation, the piecewise linear log component 114 receives an input of a floating-point number. The floating-point number may be the exponent to which another fixed value (e.g., the base) is raised to produce the floating-point number. Furthermore, an input floating-point number that is based on IEEE 754 standard can contain three parts, namely, sign (S), exponent (E) and mantissa (M). The output fixed point number (also referred to as "log number") may result in two parts, namely the Z (integer) and the η (fraction). The piecewise linear log approximation component 114 can convert the floating-point number into a fixed point number. The fixed point number may refer to a binary number having a fixed number of digits after (or, in some cases, before) the decimal point. Fixed point numbers may also represent fractional values.

The piecewise linear anti-log component 116 computes an anti-log operation, which is an inverse operation to the log operation of the piecewise linear log component 114. As discussed above, the anti-log operation is the inverse of the log of a floating-point number, thus converting the fixed point number back into the floating-point number. Details of the piecewise linear approximation log and the antilog components 114 and 116 are provided below.

The piecewise linear log approximation component 114 may receive a floating-point number as an input. A linear approximation of the floating-point number includes a plurality of interval piecewise linear equations of the floating-point number. A piecewise linear equation (linear equation) is a real-valued function defined on real numbers or intervals (may also be referred to as "segments") thereof. A real valued function is a function that assigns a real number to each member of its domain. In one implementation, the mantissa of the floating-point number is bounded between 0 and 1, which is divided into multiple intervals and approximated into the linear equations such that each linear equation corresponds to an interval among the multiple intervals. In one implementation, a mean square of the entire interval is calculated and added to the linear equation as a constant value. For any floating-point number, the mantissa is bounded between 0 and 1. In one implementation, the mantissa is divided into multiple intervals and further approximated. In one implementation, the piecewise linear log approximation component 114 utilizes the linear approximation of the floating-point number and converts into a fixed point number as described in greater detail below.

FIG. 1B illustrates a system-on-a-chip (SoC) 100 including a processing system according to an implementation of the disclosure. The SoC 100 may include a processor (such as a central processing unit (CPU)) 103 and a memory 104 that are communicably coupled and/or connected to each other via a bus system 108. In one implementation, the processor 103 is similar to the processor 102 of FIG. 1A. The processor 103 may execute tasks, such as system applications and user applications, using the memory 104 to store the instructions of the programs and data associated with the programs. In one implementation, the processor 103 includes the piecewise linear log approximation component 114, and a piecewise linear anti-log approximation component 116. The piecewise linear log and anti-log approximation components 114 and 116 respectively are circuits, to perform their designated processes, as described above.

FIG. 2A illustrates an example of a linear interval that includes a five interval piece-wise linear approximation 200 of the floating-point number between 0 and 1 including corresponding 5 linear equations 202 and the corresponding ranges of the mantissa (M). The κ linear equations 202 include a first linear equation 204 with a first corresponding range 205 of the M, a second linear equation 206 with a second corresponding range 207 of the M, a third linear equation 208 with a third corresponding range 209 of the M, a fourth linear equation 210 with a fourth corresponding range 211 of the M, and a fifth linear equation 212 with a fifth corresponding range 213 of the M. Note that each of the coefficients of the linear equations are factors of 2, which may be implemented using bit-shifts as described in greater detail below. Although FIG. 2A illustrates five intervals with corresponding five linear equations as one example, the piecewise linear log approximation component 114 may also utilize various other numbers of intervals, such as four intervals, sixteen intervals, thirty two intervals, and so on.

In one implementation, piecewise linear log approximation component 114 computes the log operation using the linear approximation of the floating-point number. The piecewise linear log approximation component 114 converts the floating-point number into a log domain using the plurality of linear equations of the floating-point number and outputs a log approximation of the floating-point number as a fixed-point number, details of which are descried below.

In one implementations, the piecewise linear log approximation component 114 receives an input of the floating-point number including a sign, an exponent, and a mantissa. As discussed above, the value of the mantissa is between 0 and 1. The piecewise linear log approximation component 114 selects an interval among the plurality of intervals of the floating-point number. In one implementation, the interval is selected based on the value of the mantissa. The piecewise linear log approximation component 114 approximates the fractional portion of a fixed point number using a linear approximation of the mantissa of the floating-point number at the selected interval. In one example, the linear approximation of the mantissa includes five separate intervals and corresponding five separate linear equations. The linear equation of a particular one of the five intervals is used to approximate the mantissa depending on a value of the mantissa in the received linear approximation of the floating-point number. The piecewise linear log approximation component 114 derives an integer of the exponent of the linear approximation of the floating-point number at the selected interval. The piecewise linear log approximation component 114 generates an output of the fixed point number including the sign, the integer and fractional portion representing the approximated mantissa.

Figure 3A:
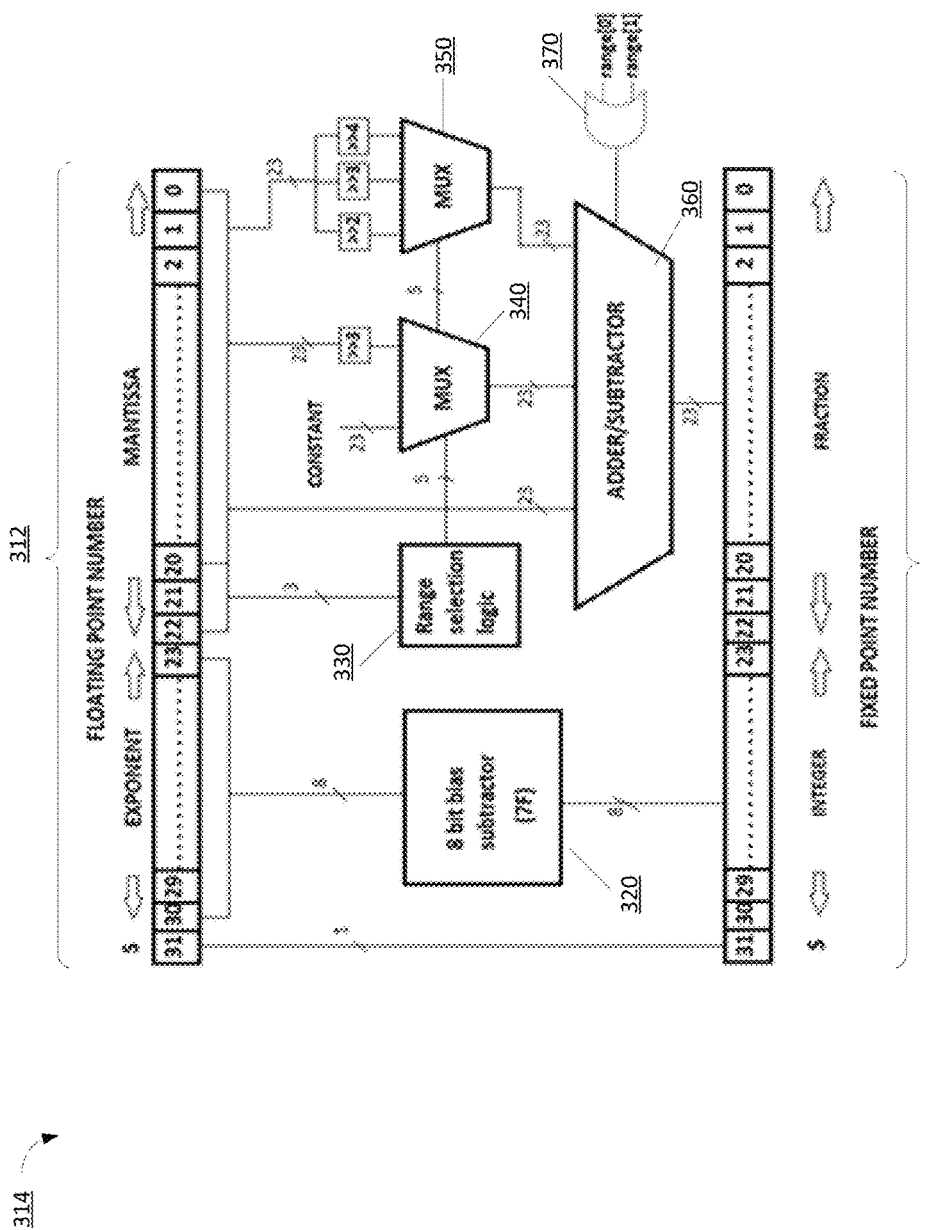
FIG. 3A illustrates an example of a logic diagram of a piecewise linear log approximation component utilizing the five intervals of FIG. 2A according to an implementation of the disclosure.

Referring to FIG. 3A, there is shown a detailed logic diagram of a piecewise linear log approximation component 314 in accordance with an implementation of the disclosure. The piecewise linear log approximation component 314 may be the same as the piecewise linear log approximation component 114 of FIG. 1A and/or FIG. 1B. In one implementation, five-interval piecewise linear approximation 200 of FIG. 2A having five linear intervals is used for the log conversion. Specifically, the five linear equations 202 corresponding to the five-interval piecewise linear approximation 200 in FIG. 2A are used to approximate the log of an input of a linear approximation of the floating-point number.

As illustrated on top portion 312 of piecewise linear log approximation component 314 of FIG. 3A, the floating-point numbers are represented as a 32-bit number with the most significant bit representing the sign (S), the next 8 bits representing an exponent (E), and remaining 23 bits representing the mantissa (M). The sign (S) bit is passed directly into a bottom portion 318 of the logic diagram. A bias from the exponent is first removed by adding it to −127 (0x81 is the hexadecimal representation) which is implemented by an incrementing block 8 bit bias subtractor 320 and inversion of the Most Significant Bit (MSB), the output of which results in an integer as illustrated in a bottom portion 318 of the logic diagram. A bias is a difference between an estimated expected value and a true value.

The piecewise linear log approximation component 314 includes a range selection logic 330, which uses the upper three bits of the mantissa of the input floating-point number to determine which linear equation among the five linear equations 202 of FIG. 2A is to be used. Specifically, the range selection logic 330 reviews the MSBs of the mantissa (M), then selects the appropriate linear equation for the log approximation using the ranges illustrated in FIG. 2A. For example, if the M value of the input floating-point number is 0.1, the first linear equation 204 in FIG. 2A is selected by the range selection logic 330 as the M value falls in the first corresponding range 205. In another example, if the M value of the input floating-point number is 0.4, then the third linear equation 208 in FIG. 2A is selected as the M falls in the third corresponding range 209.

The output of the range selection logic 330 is used to select the appropriate constants and coefficients for the selected linear equation being used among the five linear equations 202 (as shown in FIG. 2A) based on a portion of the M value. After the correct constants and coefficients are selected, the constant or the coefficients from each of the linear equations are inputted into a first multiplexer 340 and the coefficients from each of the linear equations are inputted into a second multiplexer 350. The coefficients are bit-shifts of the M portion by a set number of bits depending on which interval the M portion is a member of. So, for example, for the first linear equation 204 in FIG. 2A, there is no constant and the 3M/8 is divided into 1M/8 and 2M/8. The 1M/8 is M right shifted by 3 bits before being inputted into the first multiplexer 340 and the 2M/8 is M right shifted by 2 bits before being inputted into the second multiplexer 350. In another example, for the second linear equation 206 in FIG. 2A, the constant is ⅟64, which enters directly into the first multiplexer 340 and the M/4 is an M right shifted by two bits before being inputted into the second multiplexer 350.

The outputs of the first and the second multiplexers 340 and 350 respectively are fed to an adder/subtractor 360. For the first, second and third linear equations 204, 206 and 208, respectively, the adder in the adder/subtractor 360 is implemented for each of the first, second and the third linear equations include additions. However, for the fourth and the fifth linear equations 210 and 212, respectively, both the adder and the sub-tractor of the adder/subtractor 360 is alternatively implemented since the fourth and the fifth linear equations 210 and 212 respectively use both the addition and the subtraction. The piecewise linear log approximation component 314 also includes OR gate logic 370, which selects the adder/subtractor 360 to either function as an adder or a sub-tractor. Based on the range being either 0 or 1, the OR gate logic 370 selects the input of the adder/subtractor 360. So, when the range in the linear approximation includes an addition, the adder of the adder/subtractor 360 is selected. Whereas, when the range in the linear approximation includes a subtraction, the sub-tractor of the adder/subtractor 360 is selected. The outputs of the sign, the 8 bit bias sub-tractor 320 and the adder/subtractor 360 results in a fixed point number. As illustrated in the bottom portion 318 of FIG. 3A, the fixed-point number is represented as a 32-bit number with the most significant bit representing the sign (S), the next 8 bits representing an integer, and remaining 23 bits representing the fractional portion. As discussed above, a fixed point number is defined as a binary number that has fixed number of digits after (or sometimes) before the decimal point. Also, as discussed above, fixed point numbers represent fractional values.

In one implementation, computing exponentiation in the log domain results in a minimal error when the floating-point number inputted to the piecewise linear log approximation component 314 with mantissa between 0 and 1, and is computed in a single clock cycle. Implementations of the disclosure may use log arithmetic to compute the exponentiation in the piecewise linear log approximation component 314 using a base-2 log unit that is implemented using linear approximations of other intervals, such as sixteen linear interval.

FIG. 2B illustrates an example of a linear interval that includes a sixteen interval piece wise linear approximation 201 of the floating-point number between 0 and 1 including corresponding 16 linear equations 203 and the corresponding ranges of the mantissa (M). As discussed above, piecewise linear log approximation component 114 computes the log operation using the linear approximation of the floating-point number. The piecewise linear log approximation component 114 converts the floating-point number into a log domain using the 16 linear equations 203 of the floating-point number and outputs a log approximation of the floating-point number as a fixed-point number, details of which are descried herein below.

Figure 3B:
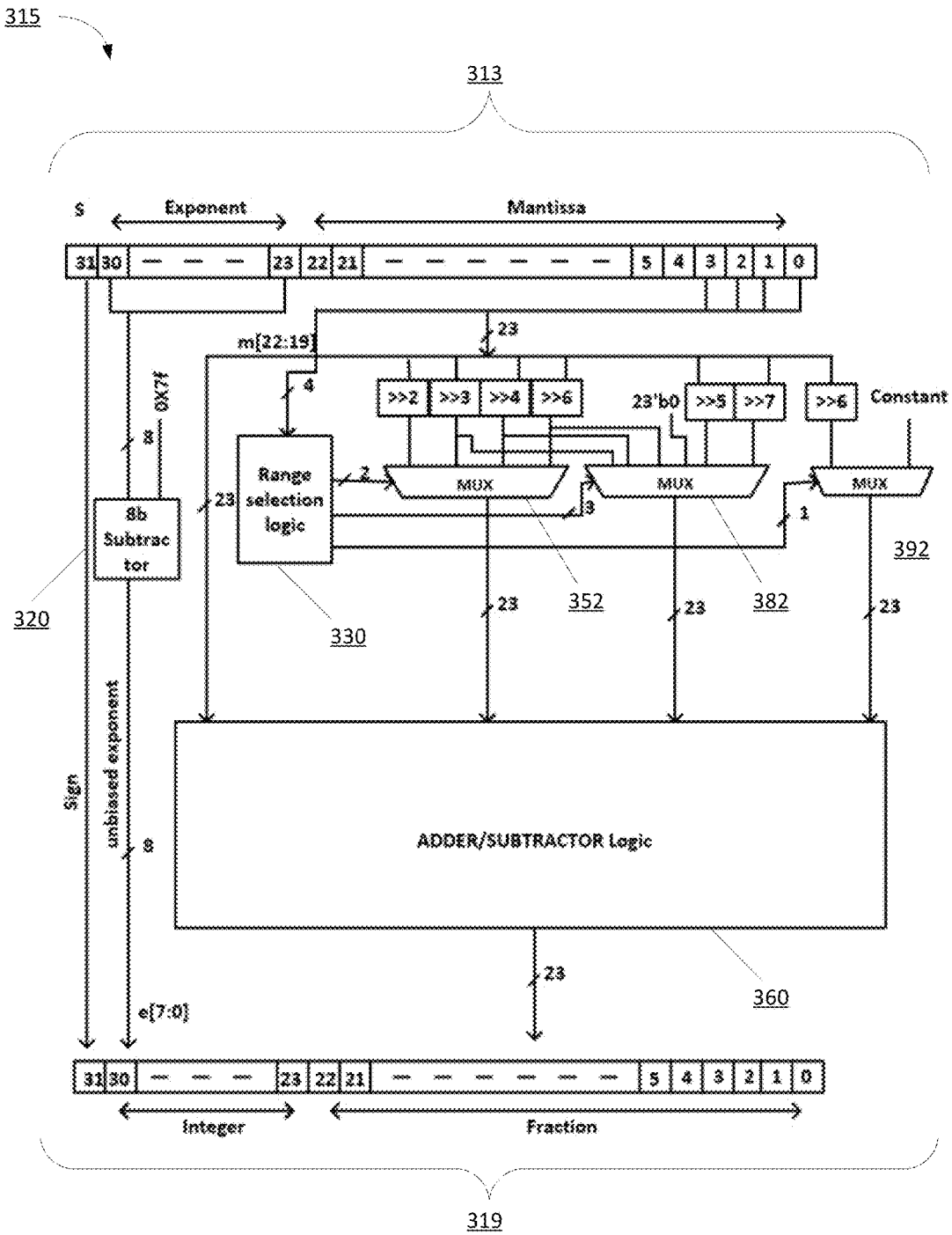
FIG. 3B illustrates an example of a logic diagram of a piecewise linear log approximation component utilizing the sixteen intervals of FIG. 2B according to an implementation of the disclosure.

Referring to FIG. 3B, there is shown a detailed logic diagram of a piecewise linear log approximation component 314 in accordance with an implementation of the disclosure. The piecewise linear log approximation component 315 may be the same as the piecewise linear log approximation component 114 of FIG. 1A and/or FIG. 1B. In one implementation, sixteen interval piecewise linear approximation 201 of FIG. 2B having sixteen linear intervals is used for the log conversion. Specifically, the sixteen linear equations 203 corresponding to the sixteen interval piecewise linear approximation 201 in FIG. 2A are used to approximate the log of an input of a linear approximation of the floating-point number.

As illustrated on top portion 313 of piecewise linear log approximation component 314 of FIG. 3B, the floating-point numbers are represented as a 32-bit number with the most significant bit representing the sign (S), the next 8 bits representing an exponent (E), and remaining 23 bits representing the mantissa (M). The sign (S) bit is passed directly into a bottom portion 319 of the logic diagram. A bias from the exponent is first removed by adding it to −127 (0x81 is the hexadecimal representation) which is implemented by the incrementing block 8 bit bias subtractor 320 and inversion of the Most Significant Bit (MSB), the output of which results in an integer as illustrated in a bottom portion 319 of the logic diagram. A bias is a difference between an estimated expected value and a true value.

The piecewise linear log approximation component 315 includes the range selection logic 330, which uses the upper three bits of the mantissa of the input floating-point number to determine which linear equation among the sixteen linear equations 203 of FIG. 2B is to be used. Specifically, the range selection logic 330 reviews the MSBs of the mantissa (M), then selects the appropriate linear equation for the log approximation using the ranges illustrated in FIG. 2B.

The output of the range selection logic 330 is used to select the appropriate constants and coefficients for the selected linear equation being used among the sixteen linear equations 203 (as shown in FIG. 2B) based on a portion of the M value. The piecewise linear log approximation component 315 also includes a first multiplexer 352, a second multiplexer 382 and a third multiplexer 392. After the correct constants and coefficients are selected, the constant or the coefficients from each of the linear equations are inputted into a third multiplexer 392 and the coefficients from each of the linear equations are inputted into the first multiplexer 352 and/or the second multiplexer 382. The coefficients are bit-shifts of the M portion by a set number of bits depending on which interval the M portion is a member of.

The outputs of the first, second and third multiplexers 352, 382 and 392 respectively are fed to an adder/subtractor 360. The outputs of the sign, the 8 bit bias subtractor 320 and the adder/subtractor 360 results in a fixed point number. As illustrated in the bottom portion 319 of FIG. 3B, the fixed-point number is represented as a 32-bit number with the most significant bit representing the sign (S), the next 8 bits representing an integer, and remaining 23 bits representing the fractional portion. As discussed above, a fixed point number is defined as a binary number that has fixed number of digits after (or sometimes) before the decimal point. Also, as discussed above, fixed point numbers represent fractional values. In one implementation, computing exponentiation in the log domain results in a minimal error when the floating-point number inputted to the piecewise linear log approximation component 315 with mantissa between 0 and 1, and is computed in a single clock cycle.

Referring back to FIG. 1A and/or FIG. 1B, in one implementation, the piecewise linear anti-log approximation component 116 receives a fixed point number. The linear approximation of a fractional portion of the fixed point number includes a plurality of piece linear equations of a fixed point number. As discussed above, a piecewise linear equation (linear equation) is a real-valued function defined on real numbers or intervals thereof. As discussed above, some examples of intervals are 4 intervals, 5 intervals, 10 intervals, 16 intervals, etc. In one implementation, the fractional portion of the fixed point number between 0 and 1 is divided into multiple intervals and approximated into linear equations such that each linear equation corresponds to an interval among the multiple intervals. In one implementation, a mean square of the entire interval is calculated and added to the linear equation as a constant value. In one implementation, the piecewise linear anti-log approximation component 116 utilizes the linear approximation of the fixed point number and converts into a floating-point number as described in greater detail below.

An example of a 4 interval piece-wise linear approximation 400 of the fixed-point number between 0 and 1 including corresponding 4 linear equations 402 is shown in FIG. 4A. The 4 linear equations include a first linear equation 404 with a first corresponding range 405 of the M, a second linear equation 406 with a second corresponding range 407 of the M, a third linear equation 408 with a third corresponding range 409 of the M, a fourth linear equation 410 with a fourth corresponding range 411 of the M. Also, each of the coefficients of the linear equation are factors of 2, which may be implemented using bit-shifts as is described in greater detail below. Although, FIG. 4A illustrates four intervals with corresponding five corresponding linear equations as one example, the piecewise linear log approximation component 114 can use various other numbers of intervals, such as five intervals, sixteen intervals, thirty two intervals, and so on.

In one implementation, the piecewise linear anti-log approximation component 116 computes the anti-log operation using the linear approximation of the fixed point number. In one implementation, piecewise linear anti-log approximation component 116 approximates a mantissa of a floating-point number from the fractional portion of the fixed point number and derives an exponent of the floating-point number using the linear equations of the fixed point number and outputs a representation of the approximated mantissa and the derived component as a floating-point number, details of which are provided below.

In one implementation, the piecewise linear anti-log approximation component 116 receives an input of a fixed point number including a sign, an integer, and a fractional portion of the fixed point number. In one implementation, the fractional portion has a value between 0 and 1. The piecewise linear anti-log approximation component 116 selects an interval among a plurality of intervals of the fixed point number. In one implementation, the interval is selected based on the value of the fractional portion of the received fixed point number. The piecewise linear anti-log approximation component 116 approximates a fractional portion of a floating-point number from a linear approximation of the fractional portion of the fixed-point number at the selected interval. In one example, the linear approximation of the fixed point number includes four separate intervals and corresponding four separate linear equations. The linear equation of a particular one of the four intervals is used to approximate the fractional portion of the floating-point number. The piecewise linear anti-log approximation component 116 derives an exponent of the integer of the piecewise linear approximation of the fixed point number at the selected interval. The piecewise linear anti-log approximation component 116 generates an output of a representation of the floating-point number including the sign, the exponent and the approximated mantissa representing the fractional portion of the floating-point number at the selected interval.

Although, the implementation of FIG. 1A and/or FIG. 1B illustrates the piecewise linear log approximation component 114 and the piecewise linear anti-log approximation component 116 implemented on the same processor 102, the piecewise linear log approximation component 114 and the piecewise linear anti-log approximation component 116 may be implemented on separate processors.

Figure 5A:
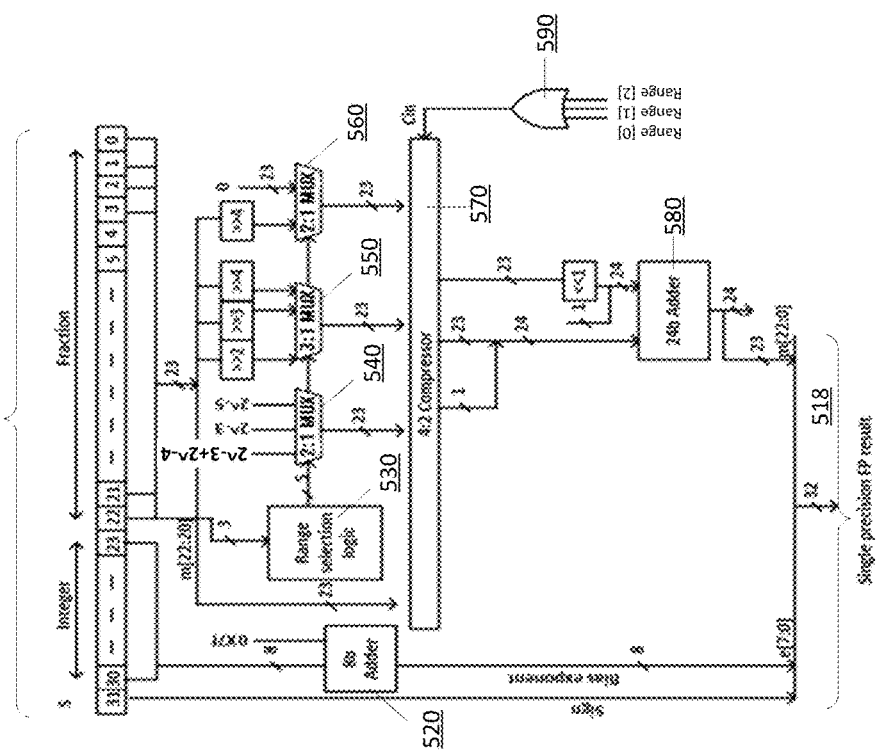
FIG. 5A illustrates an example of a logic diagram of a piecewise linear anti-log approximation component using the four intervals of FIG. 4A according to an implementation of the disclosure.

Referring to FIG. 5A, an example detailed logic diagram of a piecewise linear anti-log approximation component 516 in accordance with an implementation of the disclosure. The piecewise linear anti-log approximation component 516 may be the same as the piecewise linear anti-log approximation component 116 of FIGS. 1A and/or FIG. 1B. In one implementation, the piecewise linear approximation logic diagram of the piecewise linear anti-log approximation component 116 uses four-interval piece linear approximation 400 having four intervals which approximates the mantissa of a floating-point number from the fractional portion of the fixed point number and derives the exponent using corresponding linear equations 402 as illustrated in FIG. 4A. The implementation of the piecewise linear anti-log approximation component 516 is similar to the piecewise linear log approximation component 314 of FIG. 3A described above, except for the conversion of unbiased exponent (E) to a biased exponent (E) and the conversion of a linear approximation of the fixed point number to floating-point number as described in greater detail below.

As illustrated on top portion 512 of FIG. 5A, is an input of 32-bit fixed-point representation as a fixed point number with the MSB representing the sign (S), the next 8 bits representing an integer, unbiased E, and remaining 23 bits representing fractional ($\eta$) portion of the mantissa (M). The sign (S) bit is passed directly into bottom portion 518 of the logic diagram. The biased E for the resulting floating-point number is computed by adding 127 (0x7F) to the 8 bits representing the integer portion of the fixed point input number to obtain the biased negative exponent in a 8b adder 520, output of which results in a biased E as illustrated in the bottom portion 518 of the logic diagram. In one implementation, as shown in the FIG. 5A, the $\eta$, is 23 bits is fractional portion of the fixed point log is the input into the piecewise linear anti-log approximation component 516. Thus, $\eta=(1+M)$, but anti-log computation provides for demoralization of $\eta$. Hence $\eta$ is decreased by 1 which results into $(1+M)-1=2^\eta-1$. A compressor 570 functions may be an adder/subtractor and may function similar to the adder/subtractor 360 of FIG. 3A.

The piecewise linear anti-log approximation component 516 includes a range selection logic 530, which uses an upper bit of $\eta$ portion of the fixed point number to determine which linear equation among the four linear equations 402 of FIG. 4A is to be used. Specifically, the range selection logic 530 assesses the MSB of the $\eta$ portion, and then selects the appropriate linear equation for the log approximation using the ranges illustrated in FIG. 4A. So, for example, if the $\eta$ value of the input fixed point number is 0.1, the first linear equation 404 in FIG. 4A is selected by the range selection logic 530, the I value falls in the first corresponding range 405. In another example, if the $\eta$ value of the input fixed point number is 0.4, and then the third linear equation 408 in FIG. 4A is selected as the $\eta$ falls in the third corresponding range 409.

The M portion of the resulting floating-point number is computed by the four interval piece linear approximation 400 utilizing the four linear equations 402 and using the coefficients illustrated in FIG. 4A. The appropriate constants for the selected linear equation being used among the four linear equations 402 as shown in FIG. 4A are selected based on the range selection logic 530. After the correct constants and coefficients are selected, the constant or the coefficient from each of the linear equations are inputted into a first multiplexer 540 and the coefficients from each of the linear equations are inputted into a second multiplexer 550 or into a third multiplexer 560. The coefficients are computed using bit-shifts of the fractional portion of the input fixed point number. The coefficients are bit-shifts of the M portion by a set number of bits depending on which interval the M portion is a member of.

In one example, the first linear equation 404 in FIG. 4A, the 1+$\eta$, is directly input into the compressor 570. Since, there is no constant in the first linear equation 404, nothing is selected from the first multiplexer 540; ¼$\eta$ (in first linear equation 404) is right shifted by 2 bits before being inputted into the second multiplexer 550 and 0 is selected as an input into the third multiplexer 560. The output of the second multiplexer 550 is directly input into the compressor 570. As the first linear equation is a subtraction of 1+$\eta$ with ¼$\eta$, the sub-tractor of the compressor 570 is selected. In one example, the second linear equation 406 in FIG. 4A, the $\eta$+1, is directly input into the compressor 570, and s the constant is ¹⁄₃₂, the 2^0.5 is selected as an input to the first multiplexer 540, and the ⅛$\eta$ is $\eta$ right shifted by 3 bits before being inputted into the second multiplexer 550 and 0 is selected as an input into the third multiplexer 560. The outputs of first and the second multiplexer, 540 and 550 respectively are directly input into the compressor 570, and since the second equation is a subtraction of 1+$\eta$ with ⅛n and the constant ¹⁄₃₂, the sub-tractor of the compressor 570 is selected.

In one example, the third linear equation 408 in FIG. 4A, the $\eta$+1, as discussed above is directly inputted into the compressor 570, and since the constant is ⅛, the 2^-3 is selected as an input into the first multiplexer 540. Also, ¹⁄₁₆$\eta$ is q right shifted by 4 bits before being inputted into the second multiplexer 550 and 0 is selected as an input into the third multiplexer 560. The outputs of the first and the second multiplexers, 540 and 550 respectively are directly inputted into the compressor 570. Since, the third linear equation is an addition of 1+$\eta$ with ⅙n and ⅛, the adder of the compressor 570 is selected.

In one example, the fourth linear equation 410 in FIG. 4A, the $\eta$+1, as discussed above is directly inputted into the compressor 570, and since the constant is ⁵⁄₁₆, the 2^-3+2^-4 is selected as an input into the first multiplexer 540. Also, ⁵⁄₁₆n is divided into ¹⁄₁₆$\eta$ and ⁴⁄₁₆$\eta$; the ¹⁄₁₆n is $\eta$ right shifted by 4 bits before being inputted into the second multiplexer 550 and the ⁴⁄₁₆$\eta$ is ¼$\eta$ and so $\eta$ is right shifted by 2 bits before being inputted into the third multiplexer 560. The outputs of the first, second and the third multiplexers 540, 550 and 560 respectively are directly inputted into the compressor 570. Since, the fourth linear equation is an addition of 1+$\eta$ with ⁵⁄₁₆n and ⁵⁄₁₆, the adder of the compressor 570 is selected.

In one implementation, the outputs of one or all of the first multiplexers 540, the second multiplexer 550 and the third multiplexer 560, along with the $\eta$+1, are input into the compressor 570. The compressor 570 adds the four inputs before passing the resulting carry, which is shifted by 1 bit and a sum to a 24b adder 580. The piecewise linear anti-log approximation component 516 also includes OR gate logic 590. In one implementation, the OR logic 590 functions similar to the OR gate logic 370 as discussed above. Based on the range being either 0, 1 or 2, the OR gate logic 590 selects the input of the 4:2 compressor 570 as being either an adder or a sub-tractor. So, when the range in the linear approximation includes an addition, the adder of the compressor 570 is selected. Whereas, when the range in the linear approximation includes a subtraction, the sub-tractor of the compressor 570 is selected. As shown, the outputs of the sign, the 8 bit adder 520 and the 24b adder 580 results in a floating-point number. As illustrated in bottom portion 518 of FIG. 5A, the floating-point number is represented as a 32-bit number with the MSB representing the sign (S), the next 8 bits representing an exponent, and remaining 23 bits representing the mantissa. The output of the floating-point is represented in the equation below.

$$2^{z+\eta} = 2^z \times 2^\eta, \ e = z + 0 \times 7F, \ 1 + m = 2^\eta$$

As discussed above, fixed point number includes two parts, Integer (Z) and Fraction ($\eta$). As discussed above, E is exponent and M is the mantissa part of floating-point number. For the piecewise linear log approximation component 314, the input is a linear approximation of the floating-point number, which includes values for E (exponent) M (mantissa). The output of piecewise linear anti log approximation component 516 is a floating-point number, which includes Z (integer) and $\eta$ (fraction). The input to the piecewise linear anti-log approximation component 516 is the fixed point number and generates an output into a floating-point number in a floating point format. The equation above shows the fixed point number to floating-point number conversion from log domain to general domain. Since the linear approximation of the fixed point number is received in log base2 domain, the log to antilog conversion is represented as $2^{z+\eta}$. During the conversion from log to antilog, the unbiased exponent E is converted into a biased exponent by adding 7F (hexadecimal value=~decimal equivalent is 127 highest value that a single 8 bit can achieve, since exponent is of 8 bit).

In one implementation, computing exponentiation in the anti-log domain results in a minimal error when the linear approximation of the fixed point number that is input to the piecewise linear anti-log approximation component 516 with fraction between 0 and 1, and can be computed in a single clock cycle as described above. Implementations of the disclosure may use anti-log arithmetic to compute the exponentiation in the piecewise linear anti-log approximation component 516 using a base-2 anti-log unit that is implemented using linear approximations of other intervals, such as sixteen linear interval.

An example of a 16 interval piece-wise linear approximation 401 of the fixed-point number between 0 and 1 including corresponding 16 linear equations 403 with their corresponding ranges as shown in FIG. 4B.

Figure 5B:
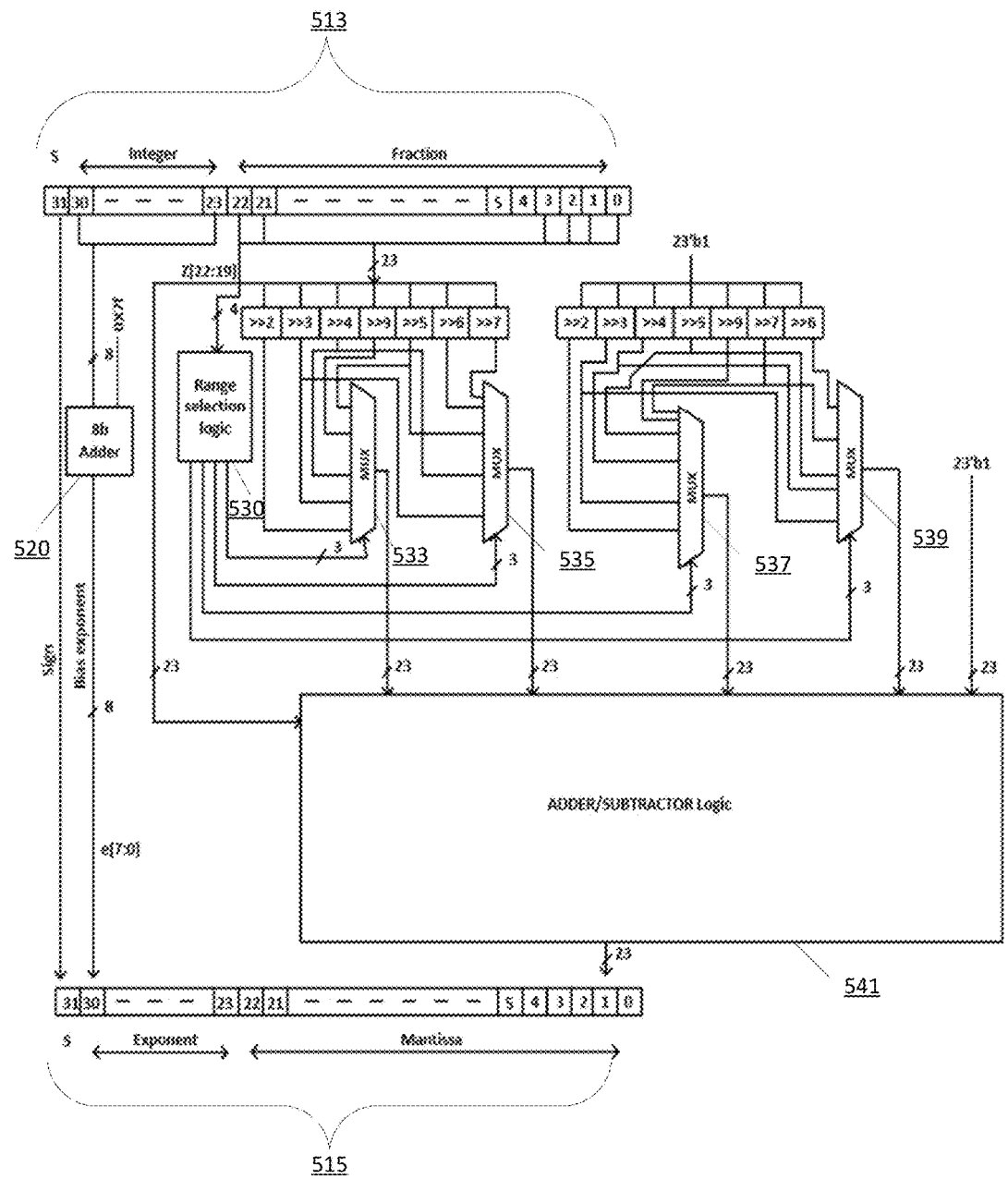
FIG. 5B illustrates an example of a logic diagram of a piecewise linear anti-log approximation component using the sixteen intervals of FIG. 4B according to an implementation of the disclosure.

Referring to FIG. 5B, an example detailed logic diagram of a piecewise linear anti-log approximation component 517 in accordance with an implementation of the disclosure. The piecewise linear anti-log approximation component 515 may be the same as the piecewise linear anti-log approximation component 116 of FIGS. 1A and/or FIG. 1B. In one implementation, the piecewise linear approximation logic diagram of the piecewise linear anti-log approximation component 116 uses sixteen-interval piece linear approximation 401 having sixteen intervals which approximates the mantissa of a floating-point number from the fractional portion of the fixed point number and derives the exponent using corresponding linear equations 403 as illustrated in FIG. 4B. The implementation of the piecewise linear anti-log approximation component 517 is similar to the piecewise linear log approximation component 315 of FIG. 3B described above, except for the conversion of unbiased exponent (E) to a biased exponent (E) and the conversion of a linear approximation of the fixed point number to floating-point number as described in greater detail below.

As illustrated on top portion 513 of FIG. 5B, is an input of 32-bit fixed-point representation as a fixed point number with the MSB representing the sign (S), the next 8 bits representing an integer, unbiased E, and remaining 23 bits representing fractional ($\eta$) portion of the mantissa (M). The sign (S) bit is passed directly into bottom portion 519 of the logic diagram. The biased E for the resulting floating-point number is computed by adding 127 (0x7F) to the 8 bits representing the integer portion of the fixed point input number to obtain the biased negative exponent in a 8b adder 520, output of which results in a biased E as illustrated in the bottom portion 519 of the logic diagram. In one implementation, as shown in the FIG. 5B, the $\eta$, is 23 bits is fractional portion of the fixed point log is the input into the piecewise linear anti-log approximation component 517. An adder/subtractor logic 541 is be an adder/subtractor and may function similar to the adder/subtractor 360 of FIG. 3B.

The piecewise linear anti-log approximation component 516 includes a range selection logic 530, which uses an upper bit of $\eta$ portion of the fixed point number to determine which linear equation among the four linear equations 402 of FIG. 4B is to be used. Specifically, the range selection logic 530 assesses the MSB of the $\eta$ portion, then selects the appropriate linear equation for the log approximation using the ranges illustrated in FIG. 4B. The M portion of the resulting floating-point number is computed by the sixteen interval piece linear approximation 401 utilizing the sixteen linear equations 403 and using the coefficients illustrated in FIG. 4B. The appropriate constants for the selected linear equation being used among the sixteen linear equations 403 as shown in FIG. 4B are selected based on the range selection logic 530. After the correct constants and coefficients are selected, the constant or the coefficient from each of the linear equations are inputted into a first multiplexer 533 and/or into a second multiplexer 535 and/or or into a third multiplexer 537 and/or into a fourth multiplexer 539. The coefficients are computed using bit-shifts of the fractional portion of the input fixed point number. The coefficients are bit-shifts of the M portion by a set number of bits depending on which interval the M portion is a member of.

In one implementation, the outputs of one or more of the first, second, third, and fourth multiplexers 533, 535, 537 and 539 respectively along with the $\eta$+1, are input into the adder/subtractor logic 541. The output of the adder/subtractor logic 541. As shown, the outputs of the sign, the 8 bit adder 520 and the adder/subtraction logic 541 results in a floating-point number. As illustrated in bottom portion 519 of FIG. 5B, the floating-point number is represented as a 32-bit number with the MSB representing the sign (S), the next 8 bits representing an exponent, and remaining 23 bits representing the mantissa.

Figure 5C:
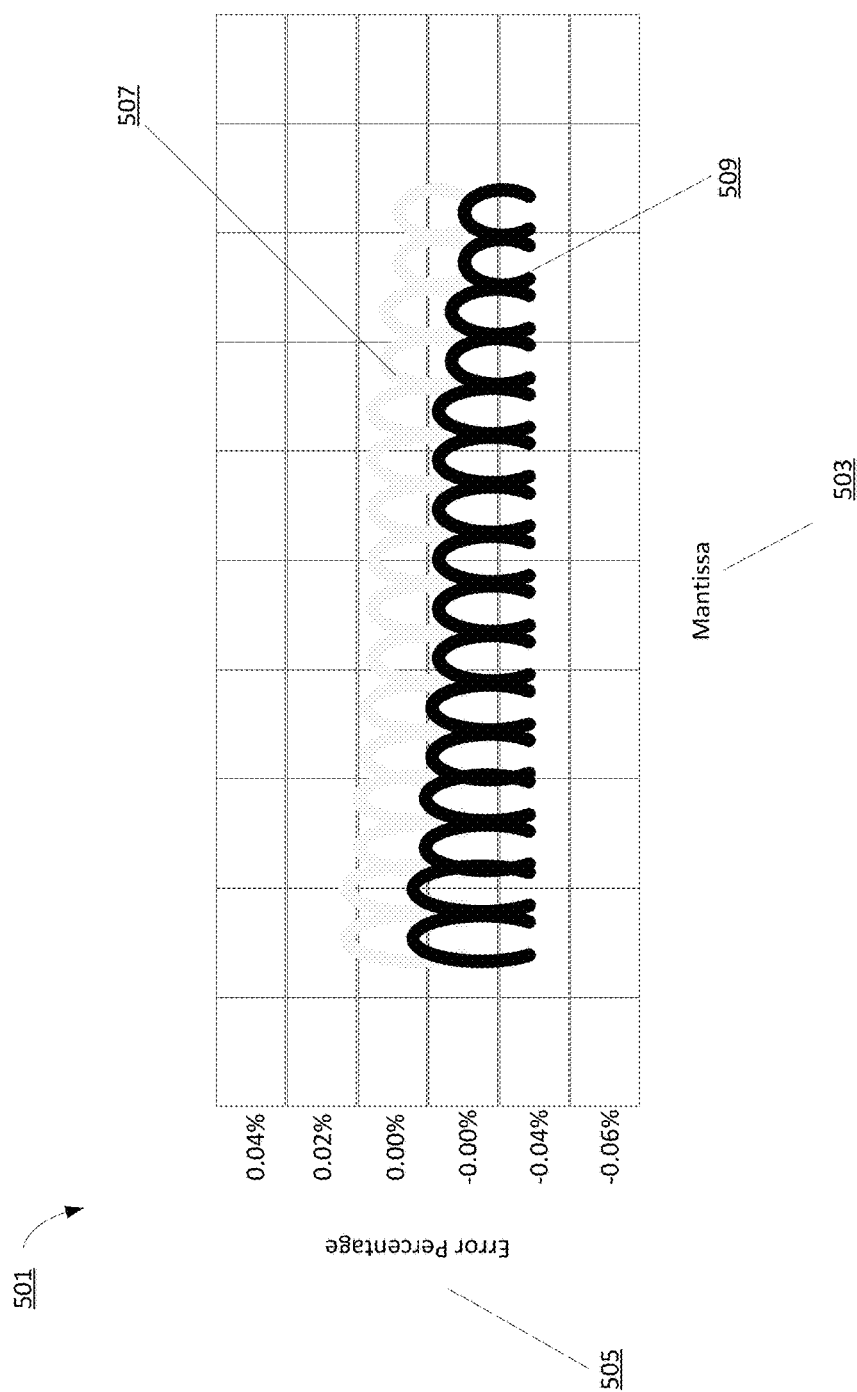
FIG. 5C illustrates an example of a graphical representation of approximation error pattern in the logarithmic and antilogarithmic operations based on piecewise linear approximation.

FIG. 5C illustrates an example of a graphical representation of approximation error pattern in the logarithmic operation (as described in FIGS. 3A and 3B above) and antilogarithmic operation (as described in FIGS. 5A and 5B above) based on piecewise linear approximations according to an implementation of the present disclosure. As shown, the x-axis illustrates the Mantissa (M) 503 and the y-axis illustrates error percentage 505. Curve 509 shows a difference in error between actual logarithmic operation and approximate logarithmic operation. Curve 511 shows a difference in error between actual antilogarithmic operation and approximate logarithmic operation. Hence, the proposed design is faster as it takes a single cycle latency, lesser area and less energy as compared to traditional look-up table approach.

Figure 6:
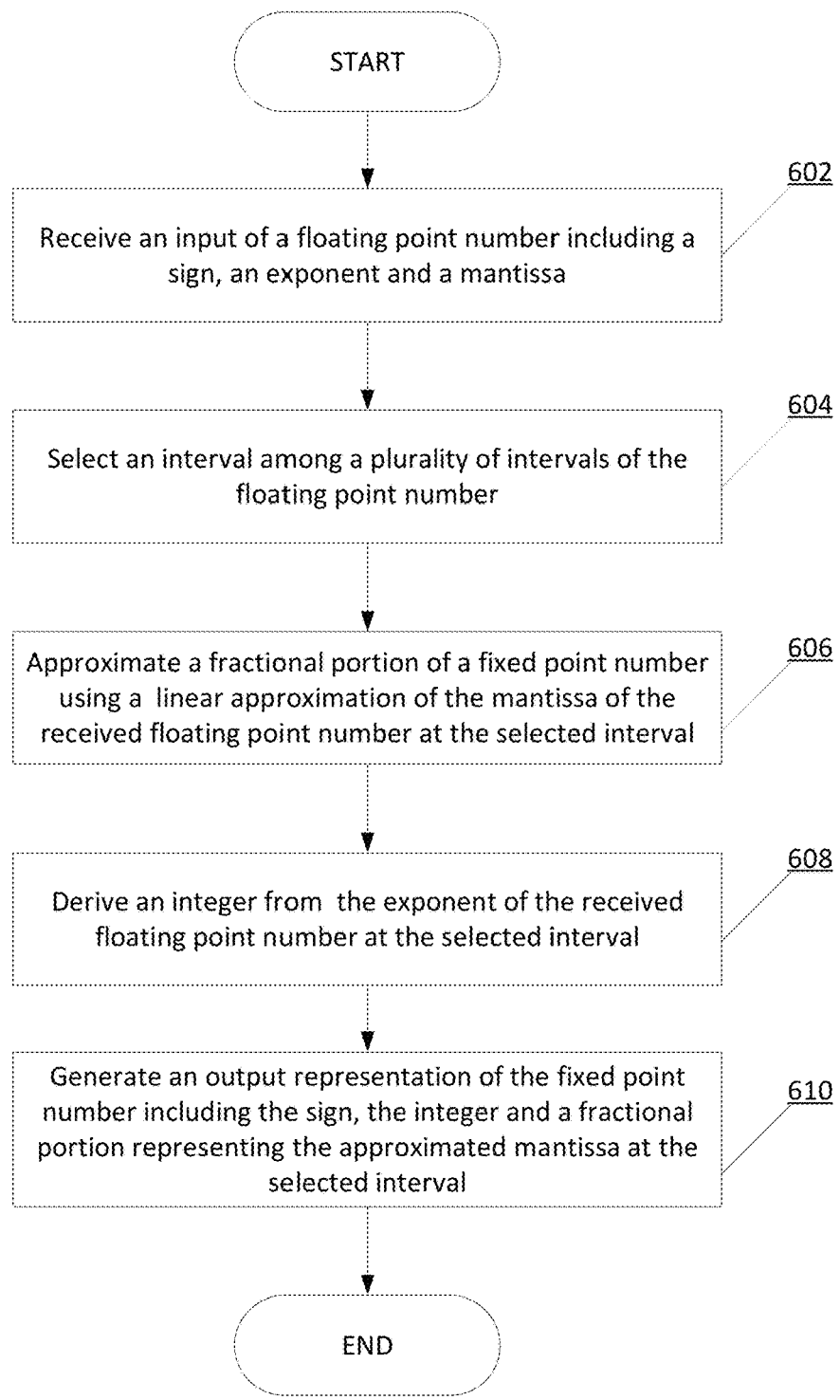
FIG. 6 illustrates a flow diagram of implementing a logarithmic operation based on piecewise linear approximation according to an implementation of the disclosure.

FIG. 6 illustrates a flow diagram of a method for implementing logarithmic operation based on piecewise linear approximation in accordance with an implementation of the disclosure. Method 600 may be performed by processing logic that may include hardware (e.g., circuitry, dedicated logic, programmable logic, microcode, etc.), software (such as instructions run on a processing system, a general purpose computer system, or a dedicated machine), firmware, or a combination thereof. In one implementation, method 600 may be performed, in part, by the piecewise linear log approximation components 114 and 314 of FIG. 1A, and/or FIG. 1B, and/or FIG. 3A and/or FIG. 3B respectively.

For simplicity of explanation, the method 600 is depicted and described as a series of acts. However, acts in accordance with this disclosure can occur in various orders and/or concurrently and with other acts not presented and described herein. Furthermore, not all illustrated acts may be performed to implement the method 600 in accordance with the disclosed subject matter. In addition, those skilled in the art will understand and appreciate that the method 600 could alternatively be represented as a series of interrelated states via a state diagram or events.

Referring to FIG. 6, at block 602, the processing logic receives an input of a floating-point number including a sign, an exponent, and a mantissa. In one implementation, the mantissa is bounded between value of 0 and 1 and divided into multiple intervals. At block 604, the processing logic selects an interval among a plurality of intervals of the floating-point number. In one implementation, the interval is selected based on the value of the mantissa. At block 606, the processing logic approximates a fractional portion of a fixed point number using a linear approximation of the mantissa of the floating-Client point number at the selected interval. In one example, the linear approximation of the mantissa includes five separate intervals and corresponding five separate linear equations. The linear equation of a particular one of the five intervals is used to approximate the mantissa of the fixed point number depending on a value of the mantissa of the received floating-point number. At block 608, the processing logic derives an integer from the exponent of the received linear approximation of the floating-point number at the selected interval. At block 610, the processing logic generates an output representation of the fixed point number including the sign, the integer and fractional portion representing the approximated mantissa at the selected interval.

Figure 7:
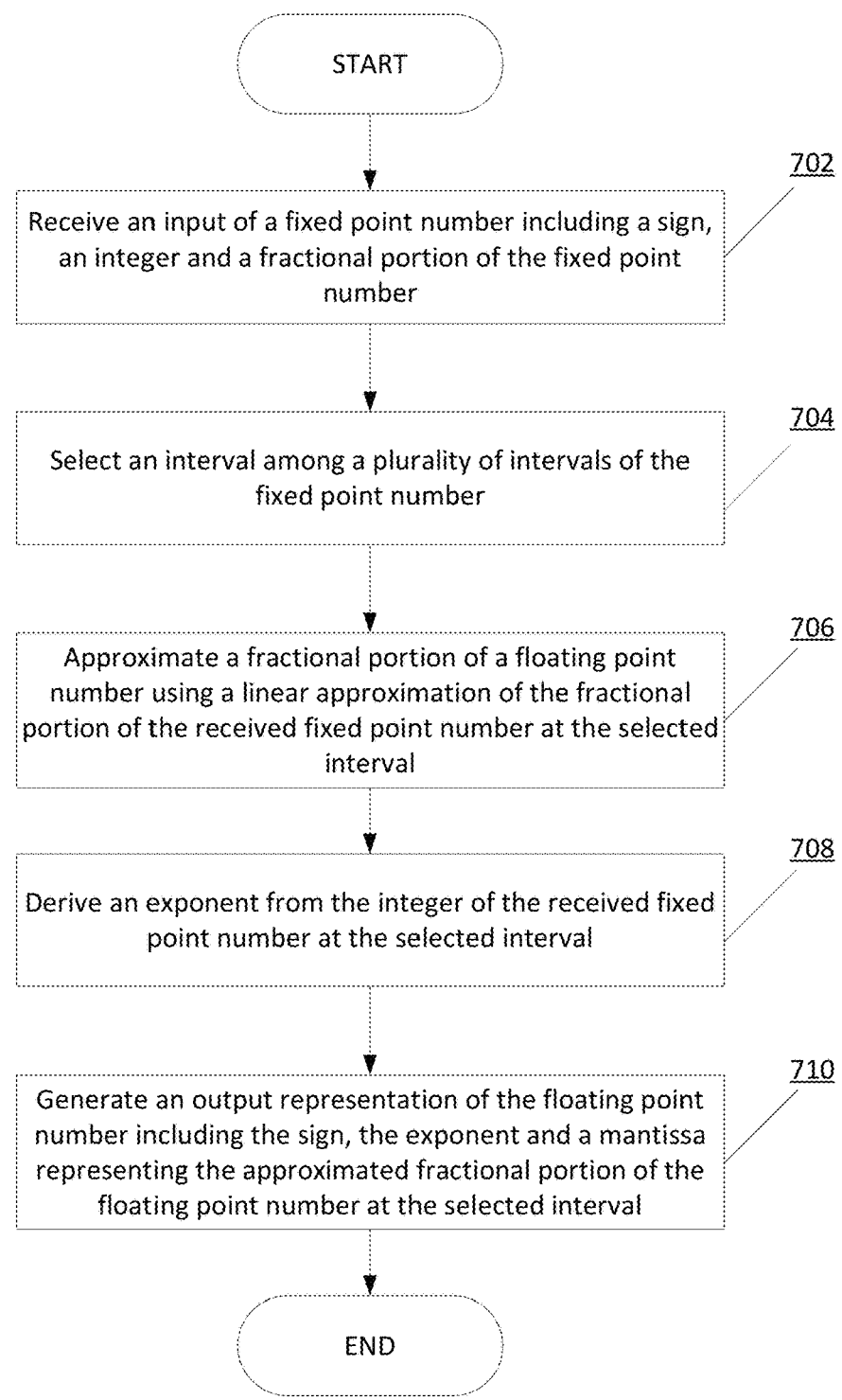
FIG. 7 illustrates a flow diagram of implementing an anti-logarithmic operation based on piecewise linear approximation according to an implementation of the disclosure.

FIG. 7 illustrates a flow diagram of a method for implementing logarithmic operation based on piecewise linear approximation in accordance with an implementation of the disclosure. Method 700 may be performed by processing logic that may include hardware (e.g., circuitry, dedicated logic, programmable logic, microcode, etc.), software (such as instructions run on a processing system, a general purpose computer system, or a dedicated machine), firmware, or a combination thereof. In one implementation, method 700 may be performed, in part, by the piecewise linear anti-log approximation components 116 and 516 of FIG. 1A, and/or FIG. 5A and/or FIG. 5B respectively.

For simplicity of explanation, the method 700 is depicted and described as a series of acts. However, acts in accordance with this disclosure can occur in various orders and/or concurrently and with other acts not presented and described herein. Furthermore, not all illustrated acts may be performed to implement the method 700 in accordance with the disclosed subject matter. In addition, those skilled in the art will understand and appreciate that the method 700 could alternatively be represented as a series of interrelated states via a state diagram or events.

Referring to FIG. 7, at block 702, the processing logic receives an input of a fixed point number including a sign, an integer, and a fractional portion of the fixed point number. In one implementation, the fractional portion has a value between 0 and 1. At block 704, the processing logic selects an interval among a plurality of intervals of the fixed point number. In one implementation, the interval is selected based on the value of the fractional portion of the received fixed point number. At block 706, the processing logic approximates a fractional portion of a floating-point number using a linear approximation of the fractional portion of the received linear approximation of the fixed-point number at the selected interval. In one example, the linear approximation of the fixed point number includes four separate intervals and corresponding four separate linear equations. The linear equation of a particular one of the four intervals is used to approximate the fractional portion of the received fixed point number. At block 708, the processing logic derives an exponent from the integer of the received linear approximation of the fixed point number at the selected interval. At block 710, the processing logic generates an output representation of the floating-point number including the sign, the exponent and a mantissa representing the approximated fractional portion of the floating-point number at the selected interval.

Figure 8A:
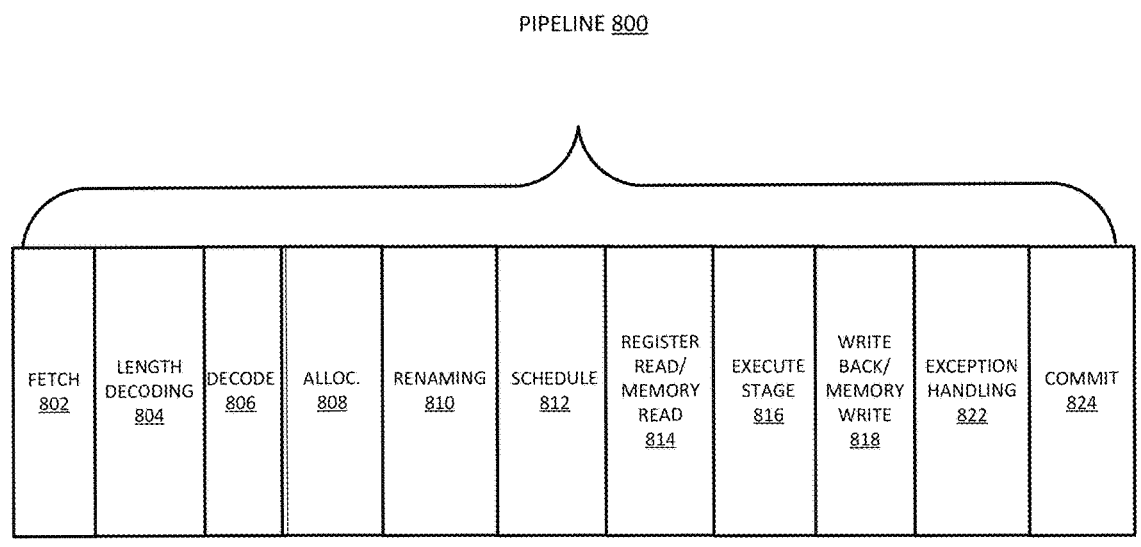
FIG. 8A is a block diagram illustrating a micro-architecture for a processor in which one implementation of the disclosure may be used.
Figure 8B:
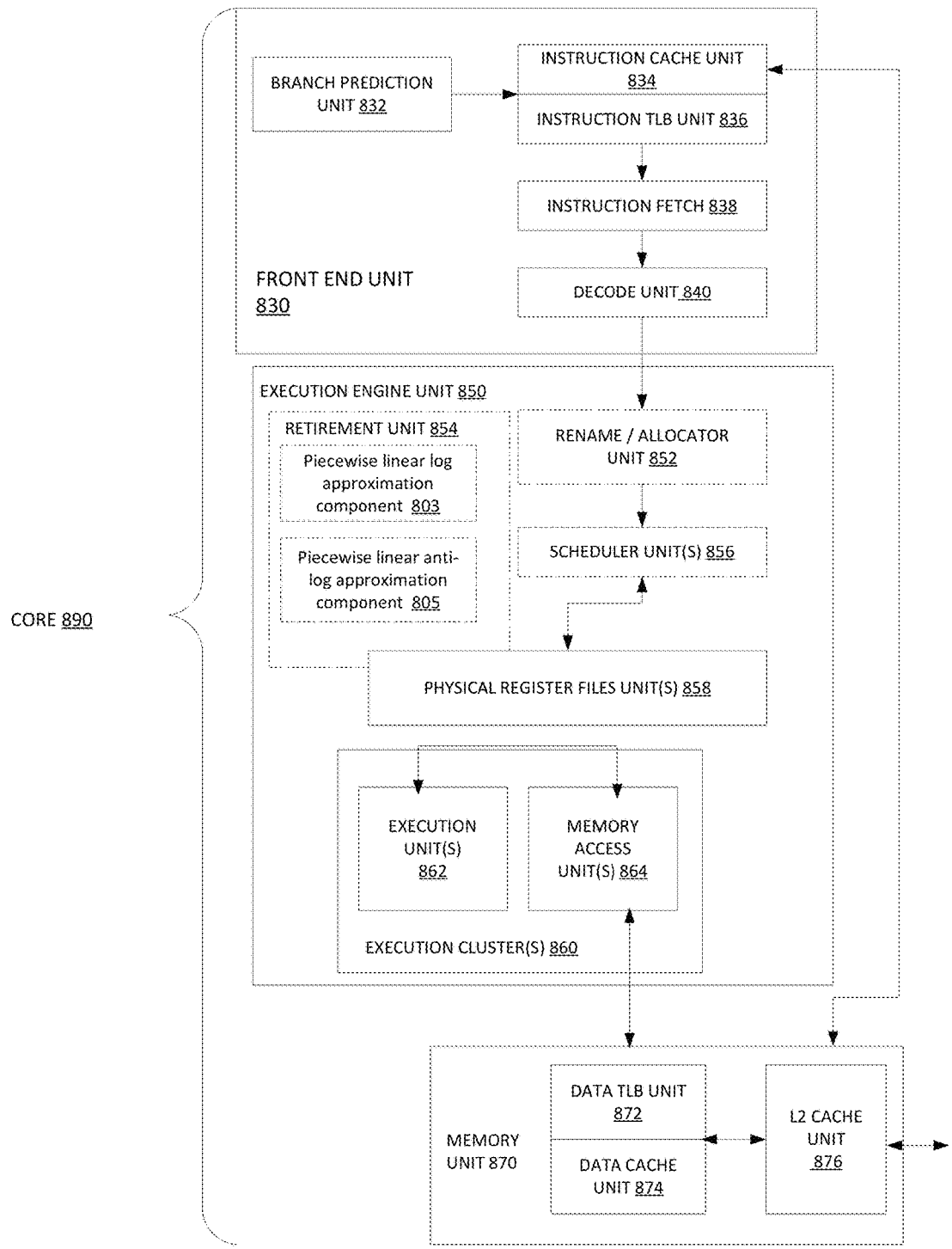
FIG. 8B is a block diagram illustrating an in-order pipeline and a register renaming stage, out-of-order issue/execution pipeline implemented according to at least one implementation of the disclosure.

FIG. 8A is a block diagram illustrating an in-order pipeline and a register re-naming stage, out-of-order issue/execution pipeline of a processor monitoring performance of a processing device to manage non-precise events according to at least one implementation of the disclosure. FIG. 8B is a block diagram illustrating an in-order architecture core and a register renaming logic, out-of-order issue/execution logic to be included in a processor according to at least one implementation of the disclosure. The solid lined boxes in FIG. 8A illustrate the in-order pipeline, while the dashed lined boxes illustrates the register renaming, out-of-order issue/execution pipeline. Similarly, the solid lined boxes in FIG. 8B illustrate the in-order architecture logic, while the dashed lined boxes illustrates the register renaming logic and out-of-order issue/execution logic.

In FIG. 8A, a processor pipeline 800 includes a fetch stage 802, a length decode stage 804, a decode stage 806, an allocation stage 808, a renaming stage 810, a scheduling (also known as a dispatch or issue) schedule stage 812, a register read/memory read stage 814, an execute stage 816, a write back/memory write stage 818, an exception handling stage 822, and a commit stage 824. In some implementations, the stages are provided in a different order and different stages may be considered in-order and out-of-order.

In FIG. 8B, arrows denote a coupling between two or more units and the direction of the arrow indicates a direction of data flow between those units. FIG. 8B shows processor core (core) 890 including a front end unit 830 coupled to an execution engine unit 850, and both are coupled to a memory unit 70.

The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression engine, graphics core, or the like.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 834 is further coupled to a level 2 (L2) cache unit 876 in the memory unit 870. The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The retirement unit 854 may include a piecewise linear log approximation component 803 for implementing a logarithmic operation based on piecewise linear approximation and a piecewise linear anti-log approximation 805 for implementing an anti-logarithmic operation based on piecewise linear approximation according to implementations of the disclosure. The scheduler unit(s) 856 represents any number of different schedulers, including reservations stations, central instruction window, etc. The scheduler unit(s) 856 is coupled to the physical register file(s) unit(s) 858. Each of the physical register file(s) units 858 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 858 is overlapped by the retirement unit 854 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and on various types of data (e.g., scalar floating point, packed integer, packed floating point, vector integer, vector floating point).

While some implementations may include a number of execution units dedicated to specific functions or sets of functions, other implementations may include one execution unit or multiple execution units that all perform all functions. The scheduler unit(s) 856, physical register file(s) unit(s) 858, and execution cluster(s) 860 are shown as being possibly plural because certain implementations create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain implementations are implemented in which the execution cluster of this pipeline has the memory access unit(s) 864). It should also be understood that where separate pipelines are used, one or more of these pipelines may be out-of-order issue/execution and the rest in-order.

The set of memory access units 864 is coupled to the memory unit 870, which includes a data TLB unit 872 coupled to a data cache unit 874 coupled to a level 2 (L2) cache unit 876. In one exemplary implementation, the memory access units 864 may include a load unit, a store address unit, and a store data unit, each of which is coupled to the data TLB unit 872 in the memory unit 870. The L2 cache unit 876 is coupled to one or more other levels of cache and eventually to a main memory.

By way of example, the exemplary register renaming, out-of-order issue/execution core architecture may implement the pipeline 800 as follows: 1) the instruction fetch 38 performs the fetch and length decoding stages 802 and 804 respectively; 2) the decode unit 840 performs the decode stage 806; 3) the rename/allocator unit 852 performs the allocation stage 808 and renaming stage 810; 4) the scheduler unit(s) 856 performs the schedule stage 812; 5) the physical register file(s) unit(s) 858 and the memory unit 870 perform the register read/memory read stage 814; the execution cluster 860 perform the execute stage 816; 6) the memory unit 870 and the physical register file(s) unit(s) 858 perform the write back/memory write stage 818; 7) various units may be involved in the exception handling stage 822) the retirement unit 854 and the physical register file(s) unit(s) 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in-order architecture. While the illustrated implementation of the processor also includes a separate instruction and data cache units 834/874 and a shared L2 cache unit 876, alternative implementations may have a single internal cache for both instructions and data, such as, for example, a Level 1 (L1) internal cache, or multiple levels of internal cache. In some implementations, the system may include a combination of an internal cache and an external cache that is external to the core and/or the processor. Alternatively, all of the cache may be external to the core and/or the processor.

Figure 9:
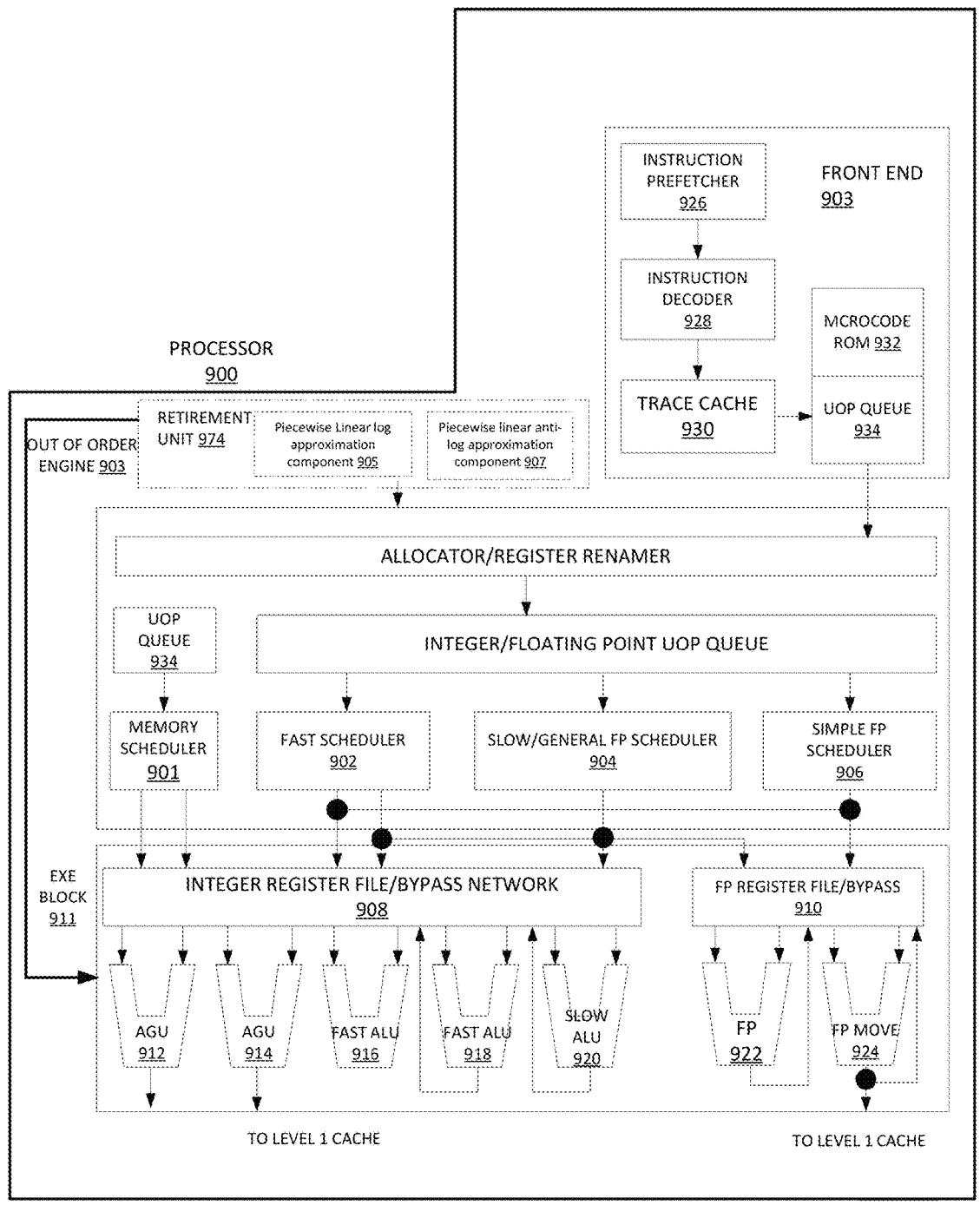
FIG. 9 illustrates a block diagram of the micro-architecture for a processor in accordance with one implementation of the disclosure.

FIG. 9 is a block diagram illustrating a micro-architecture for a processor 900 that includes logic circuits to perform instructions in accordance with one implementation of the disclosure. In one implementation, processor 900 monitors performance of a processing device to manage non-precise events. In some implementations, an instruction in accordance with one implementation can be implemented to operate on data elements having sizes of byte, word, double word, quad word, etc., as well as datatypes, such as single and double precision integer and floating point datatypes. In one implementation the in-order front end 903 is the part of the processor 900 that fetches instructions to be executed and prepares them to be used later in the processor pipeline. The front end 903 may include several units. In one implementation, the instruction pre fetcher 926 fetches instructions from memory and feeds them to an instruction decoder 928, which in turn decodes or interprets them. For example, in one implementation, the decoder decodes a received instruction into one or more operations called "micro-instructions" or "micro-operations" (also called micro op or uops) that the machine can execute.

In other implementations, the decoder parses the instruction into an opcode and corresponding data and control fields that are used by the micro-architecture to perform operations in accordance with one implementation. In one implementation, the trace cache 930 takes decoded uops and assembles them into program ordered sequences or traces in the uop queue 934 for execution. When the trace cache 930 encounters a complex instruction, the microcode ROM 932 provides the uops needed to complete the operation.

Some instructions are converted into a single micro-op, whereas others use several micro-ops to complete the full operation. In one implementation, if more than four micro-ops are needed to complete an instruction, the decoder 928 accesses the microcode ROM 932 to do the instruction. For one implementation, an instruction can be decoded into a SM3 all number of micro ops for processing at the instruction decoder 928. In another implementation, an instruction can be stored within the microcode ROM 932 should a number of micro-ops be needed to accomplish the operation. The trace cache 930 refers to an entry point programmable logic array (PLA) to determine a correct micro-instruction pointer for reading the micro-code sequences to complete one or more instructions in accordance with one implementation from the micro-code ROM 932. After the microcode ROM 932 finishes sequencing micro-ops for an instruction, the front end 903 of the machine resumes fetching micro-ops from the trace cache 930.

The out-of-order execution engine 903 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler 901, fast scheduler 902, slow/general floating point scheduler 904, and simple floating point scheduler 906. The fast scheduler, 902, slow/general floating point scheduler 904, and the simple floating point scheduler 906 determine when a uop is ready to execute based on the readiness of their dependent input register operand sources and the availability of the execution resources the uops use to complete their operation. The fast scheduler 902 of one implementation can schedule on each half of the main clock cycle while the other schedulers can schedule once per main processor clock cycle. The schedulers arbitrate for the dispatch ports to schedule uops for execution.

Register files 908, 910 sit between the fast scheduler 902, slow/general floating point scheduler 904, and simple floating point scheduler 906, and the execution units 912, 914, 916, 918, 920, 922, 924 in the execution block 911. There is a separate register file for integer and floating point operations, respectively. Each register file 908, 910, of one implementation also includes a bypass network that can bypass or forward just completed results that have not yet been written into the register file to new dependent uops. The integer register file 908 and the floating point register file 910 are also capable of communicating data with the other. For one implementation, the integer register file 908 is split into two separate register files, one register file for the low order 32 bits of data and a second register file for the high order 32 bits of data. The floating point register file 910 of one implementation has 128 bit wide entries because floating point instructions typically have operands from 66 to 128 bits in width.

The execution block 911 contains the execution units 912, 914, 916, 918, 920, 922, 924, where the instructions are actually executed. This section includes the register files 908, 910, that store the integer and floating point data operand values that the micro-instructions use to execute. The processor 900 of one implementation is comprised of a number of execution units: address generation unit (AGU) 912, AGU 914, fast ALU 916, fast ALU 918, slow ALU 920, floating point ALU 922, floating point move unit 924. For one implementation, the floating point execution blocks 922, 924, execute floating point, MMX, SIMD, and SSE, or other operations. The floating point ALU 922 of one implementation includes a 64 bit by 54 bit floating point divider to execute divide, square root, and remainder micro-ops. For implementations of the disclosure, instructions involving a floating point value may be handled with the floating point hardware.

In one implementation, the ALU operations go to the high-speed ALU execution units 916, 918. The fast ALUs 916, 918, of one implementation can execute fast operations with an effective latency of half a clock cycle. For one implementation, most complex integer operations go to the slow ALU 920 as the slow ALU 920 includes integer execution hardware for long latency type of operations, such as a multiplier, shifts, flag logic, and branch processing. Memory load/store operations are executed by the AGUs 912, 914. For one implementation, the integer ALUs 916, 918, 920 are described in the context of performing integer operations on 64 bit data operands. In alternative implementations, the ALUs 916, 918, 920 can be implemented to support a variety of data bits including 16, 32, 128, 256, etc. Similarly, the floating point units 922, 924 can be implemented to support a range of operands having bits of various widths. For one implementation, the floating point units 922, 924 can operate on 128 bits wide packed data operands in conjunction with SIMD and multimedia instructions.

In one implementation, the uops schedulers 901, 902, 904, 906 dispatch dependent operations before the parent load has finished executing. As uops are speculatively scheduled and executed in processor 900, the processor 900 also includes logic to handle memory misses. If a data load misses in the data cache, there can be dependent operations in flight in the pipeline that have left the scheduler with temporarily incorrect data. A replay mechanism tracks and re-executes instructions that use incorrect data. The dependent operations should be replayed and the independent ones are allowed to complete. The schedulers and replay mechanism of one implementation of a processor are also designed to catch instruction sequences for text string comparison operations.

The processor 900 may include a retirement unit 954 coupled to the execution block 911. The retirement unit 954 may include a piecewise linear log approximation component 905 implementing a logarithmic operation based on piecewise linear approximation and an piecewise linear log approximation component 907 implementing an anti-logarithmic operation based on piecewise linear approximation based on implementations of the present disclosure. The term "registers" may refer to the on-board processor storage locations that are used as part of instructions to identify operands. In other words, registers may be those that are usable from the outside of the processor (from a programmer's perspective). However, the registers of an implementation should not be limited in meaning to a particular type of circuit. Rather, a register of an implementation is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one implementation, integer registers store thirty-two bit integer data.

A register file of one implementation also contains eight multimedia SIMD registers for packed data. For the discussions below, the registers are understood to be data registers designed to hold packed data, such as 64 bits wide MMX registers (also referred to as 'mm' registers in some instances) in microprocessors enabled with the MMX™ technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one implementation, in storing packed data and integer data, the registers do not differentiate between the two data types. In one implementation, integer and floating point are contained in either the same register file or different register files. Furthermore, in one implementation, floating point and integer data may be stored in different registers or the same registers.

Figure 10:
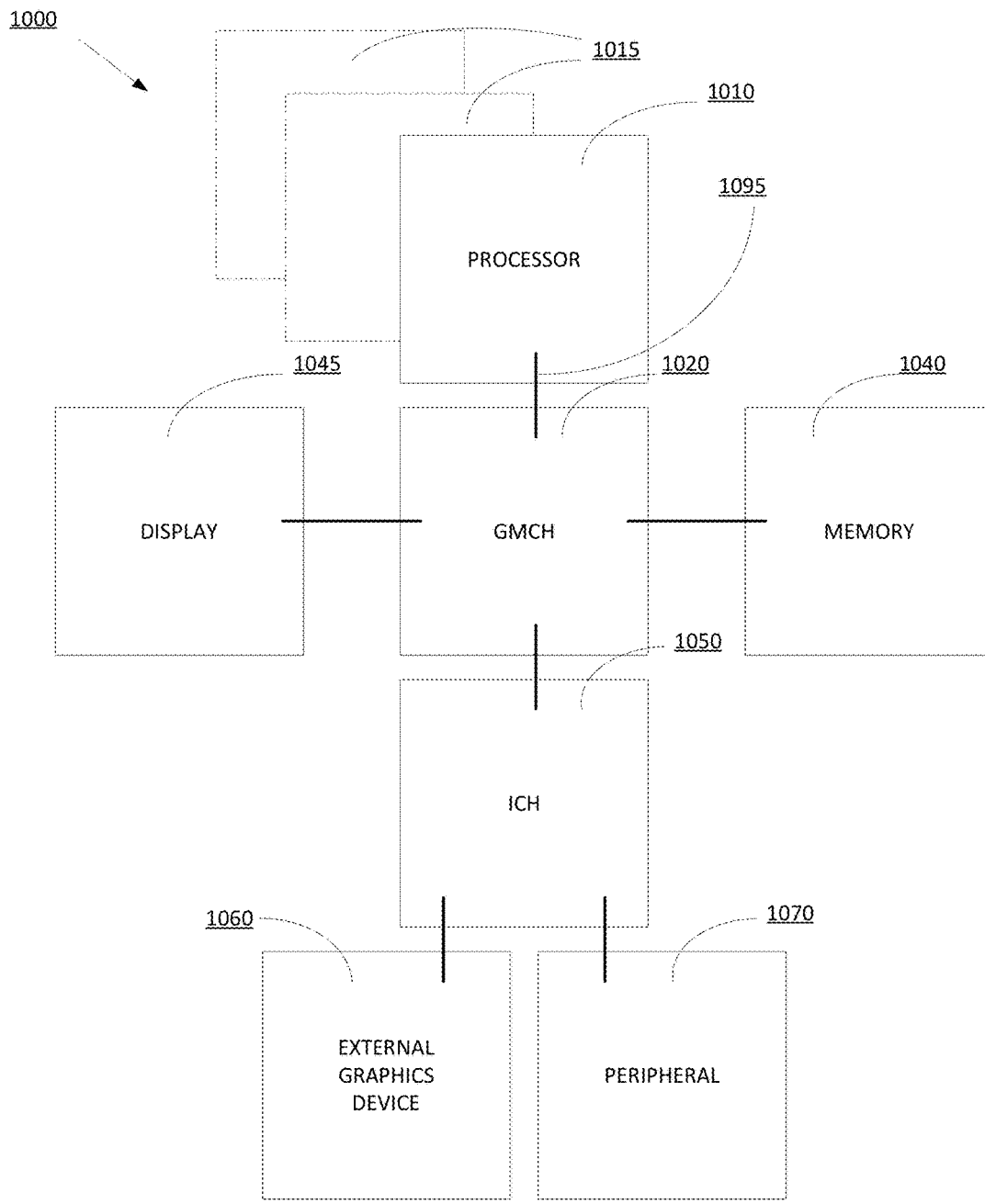
FIG. 10 is a block diagram illustrating a system in which an implementation of the disclosure may be used.

Referring now to FIG. 10, shown is a block diagram of a system 1000 in accordance with one implementation of the disclosure. The system 1000 may include one or more processors 1010, 1015, which are coupled to graphics memory controller hub (GMCH) 1020. The optional nature of additional processors 1015 is denoted in FIG. 10 with broken lines. In one implementation, a processor 1010, 1015 monitors performance of a processing device to manage non-precise events.

Each processor 1010, 1015 may be some version of the circuit, integrated circuit, processor, and/or silicon integrated circuit as described above. However, it should be noted that it is unlikely that integrated graphics logic and integrated memory control units would exist in the processors 1010, 1015. FIG. 10 illustrates that the GMCH 1020 may be coupled to a memory 1040 that may be, for example, a dynamic random access memory (DRAM). The DRAM may, for at least one implementation, be associated with a non-volatile cache.

The GMCH 1020 may be a chipset, or a portion of a chipset. The GMCH 1020 may communicate with the processor(s) 1010, 1015 and control interaction between the processor(s) 1010, 1015 and memory 1040. The GMCH 1020 may also act as an accelerated bus interface between the processor(s) 1010, 1015 and other elements of the system 1000. For at least one implementation, the GMCH 1020 communicates with the processor(s) 1010, 1015 via a multi-drop bus, such as a front side bus (FSB) 1095.

Furthermore, GMCH 1020 is coupled to a display 1045 (such as a flat panel or touchscreen display). GMCH 1020 may include an integrated graphics accelerator. GMCH 1020 is further coupled to an input/output (I/O) controller hub (ICH) 1050, which may be used to couple various peripheral devices to system 1000. Shown for example in the implementation of FIG. 10 is an external graphics device 1060, which may be a discrete graphics device coupled to ICH 1050, along with another peripheral device 1070.

Alternatively, additional or different processors may also be present in the system 1000. For example, additional processor(s) 1015 may include additional processors(s) that are the same as processor 1010, additional processor(s) that are heterogeneous or asymmetric to processor 1010, accelerators (such as, e.g., graphics accelerators or digital signal processing (DSP) units), field programmable gate arrays, or any other processor. There can be a variety of differences between the processor(s) 1010, 1015 in terms of a spectrum of metrics of merit including architectural, micro-architectural thermal, power consumption characteristics, and the like. These differences may effectively manifest themselves as asymmetry and heterogeneity amongst the processors 1010, 1015. For at least one implementation, the various processors 1010, 1015 may reside in the same die package.

Figure 11:
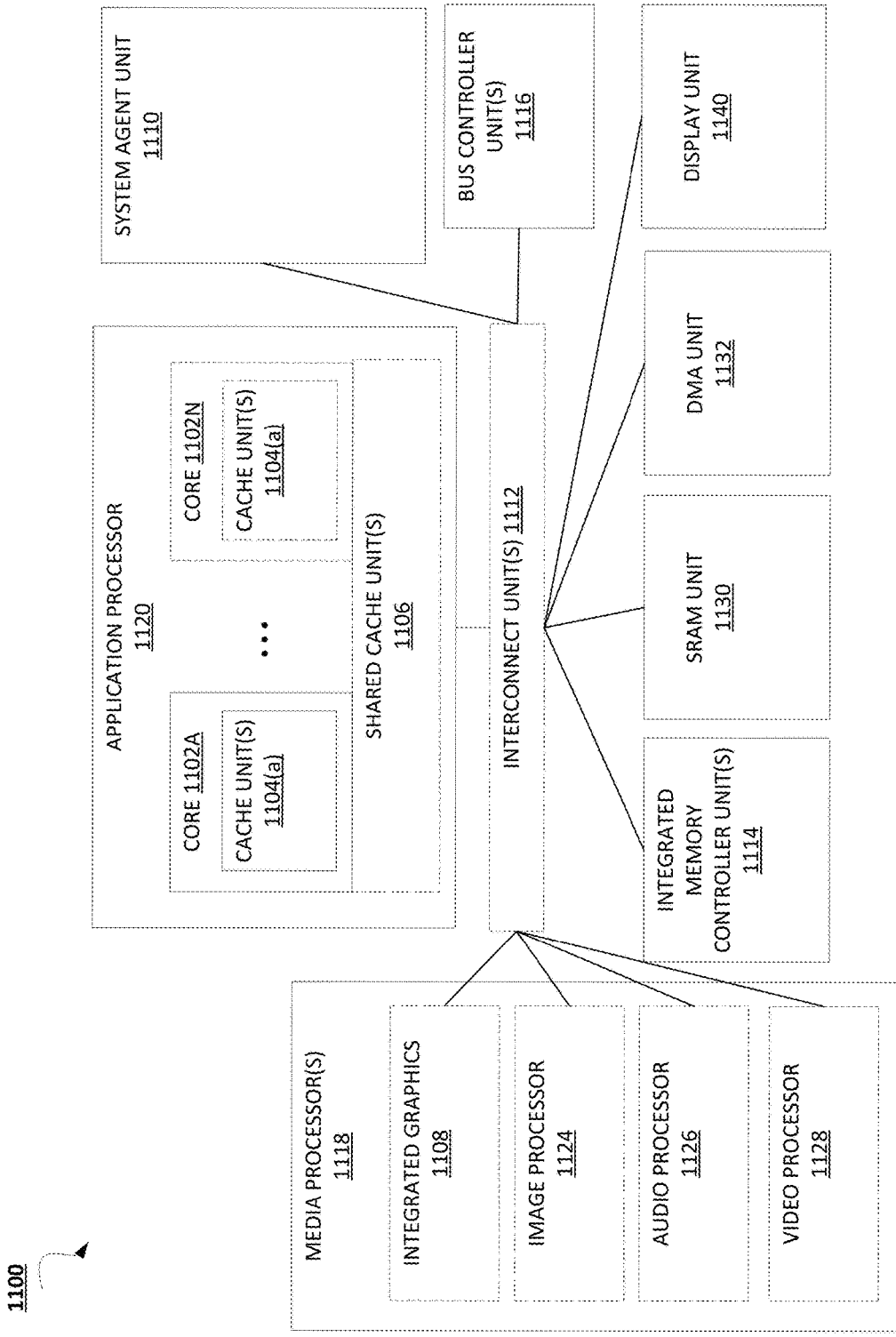
FIG. 11 is a block diagram of a system in which an implementation of the disclosure may operate.

Implementations may be implemented in many different system types. FIG. 11 is a block diagram of a SoC 1100 in accordance with an implementation of the present disclosure. Dashed lined boxes are optional features on more advanced SoCs. In FIG. 11, an interconnect unit(s) 1112 is coupled to: an application processor 1120 which includes a set of one or more cores 1102A-1102N and shared cache unit(s) 1106; a system agent unit 1110; a bus controller unit(s) 1116; an integrated memory controller unit(s) 1114; a set or one or more media processors 1118 which may include integrated graphics logic 1108, an image processor 1124 for providing still and/or video camera functionality, an audio processor 1126 for providing hardware audio acceleration, and a video processor 1128 for providing video encode/decode acceleration; an static random access memory (SRAM) unit 1130; a direct memory access (DMA) unit 1132; and a display unit 1140 for coupling to one or more external displays. In one implementation, a memory component may be included in the integrated memory controller unit(s) 1114. In another implementation, the memory component may be included in one or more other components of the SoC 1100 that may be used to access and/or control a memory. The application processor 1120 may include a conditional branch, indirect branch and event execution logics as described in implementations herein.

The memory hierarchy includes one or more levels of cache within the cores, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof.

In some implementations, one or more of the cores 1102A-N are capable of multi-threading.

The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the integrated graphics logic 1108. The display unit is for driving one or more externally connected displays.

The cores 1102A-N may be homogenous or heterogeneous in terms of architecture and/or instruction set. For example, some of the cores 1102A-N may be in order while others are out-of-order. As another example, two or more of the cores 1102A-N may be capable of execution the same instruction set, while others may be capable of executing a subset of that instruction set or a different instruction set.

The application processor 1120 may be a general-purpose processor, such as a Core™ i3, i5, i7, 2 Duo and Quad, Xeon™, Itanium™, Atom™, XScale™ or StrongARM™ processor, which are available from Intel™ Corporation, of Santa Clara, Calif. Alternatively, the application processor 1120 may be from another company, such as ARM Holdings™, Ltd, MIPS™, etc. The application processor 1120 may be a special-purpose processor, such as, for example, a network or communication processor, compression engine, graphics processor, co-processor, embedded processor, or the like. The application processor 1120 may be implemented on one or more chips. The application processor 1120 may be a part of and/or may be implemented on one or more substrates using any of a number of process technologies, such as, for example, BiCMOS, CMOS, or NMOS.

Figure 12:
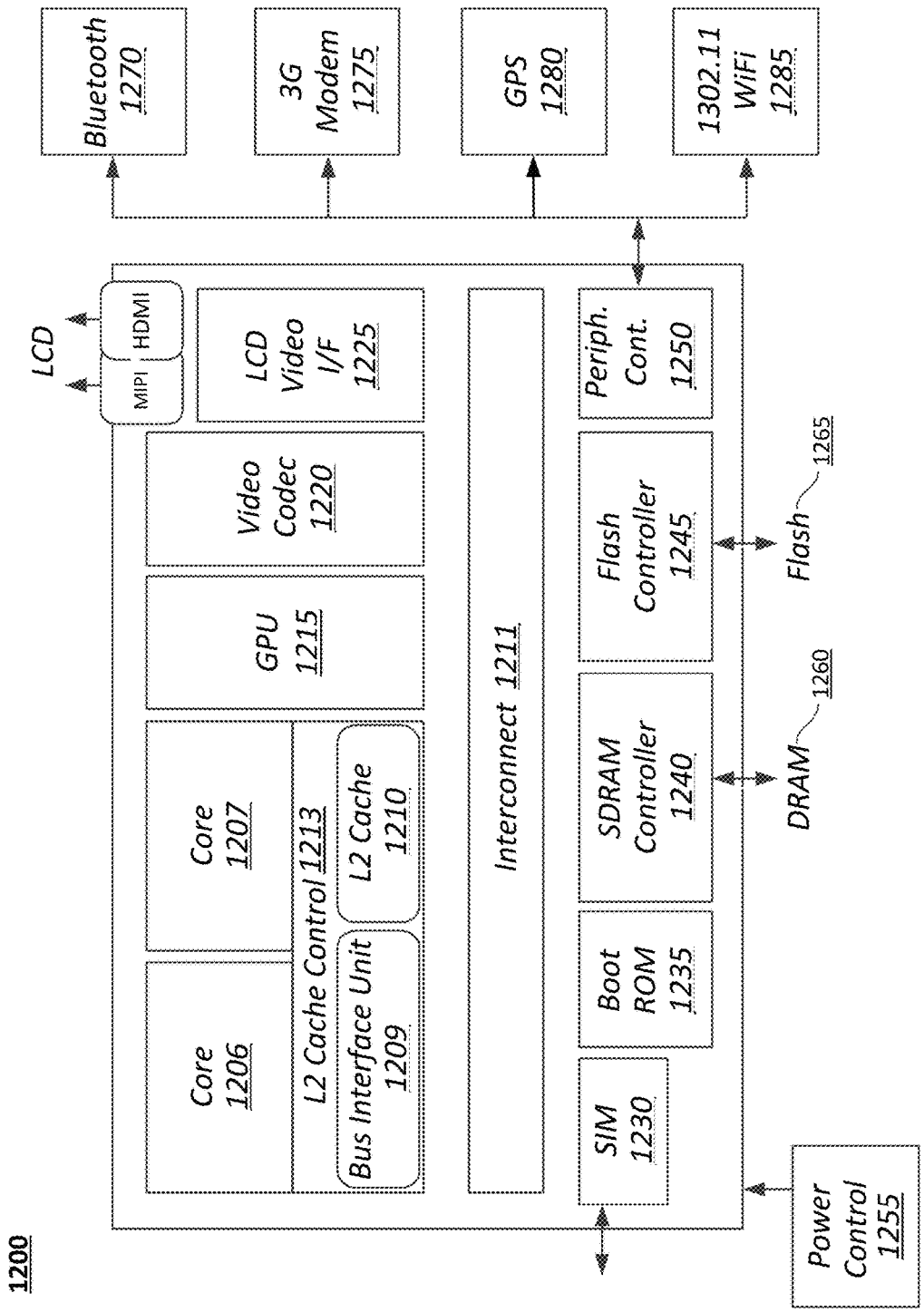
FIG. 12 is a block diagram of a system in which an implementation of the disclosure may operate.

FIG. 12 is a block diagram of an implementation of a system on-chip (SoC) design in accordance with the present disclosure. As a specific illustrative example, SoC 1200 is included in user equipment (UE). In one implementation, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1200 includes 2 cores—1206 and 1207. Cores 1206 and 1207 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1206 and 1207 are coupled to L2 cache control 1213 that is associated with bus interface unit 1208 and L2 cache 1210 to communicate with other parts of SoC 1200. Interconnect 1211 includes an on-chip interconnect, such as an IOSF, AMBA, or other interconnect discussed above, which potentially implements one or more aspects of the described disclosure. In one implementation, a conditional branch, indirect branch and event execution logics may be included in cores 1206, 1207.

Interconnect 1211 provides communication channels to the other components, such as a Subscriber Identity Module (SIM) 1230 to interface with a SIM card, a boot ROM 1235 to hold boot code for execution by cores 1206 and 1207 to initialize and boot SoC 1200, a SDRAM controller 1240 to interface with external memory (e.g. DRAM 1260), a flash controller 1245 to interface with non-volatile memory (e.g. Flash 1265), a peripheral control 1250 (e.g. Serial Peripheral Interface) to interface with peripherals, video codecs 1220 and Video interface 1225 to display and receive input (e.g. touch enabled input), GPU 1215 to perform graphics related computations, etc. Any of these interfaces may incorporate aspects of the disclosure described herein. In addition, the system 1200 illustrates peripherals for communication, such as a Bluetooth module 1270, 3G modem 1275, GPS 1280, and Wi-Fi 1285.

Figure 13:
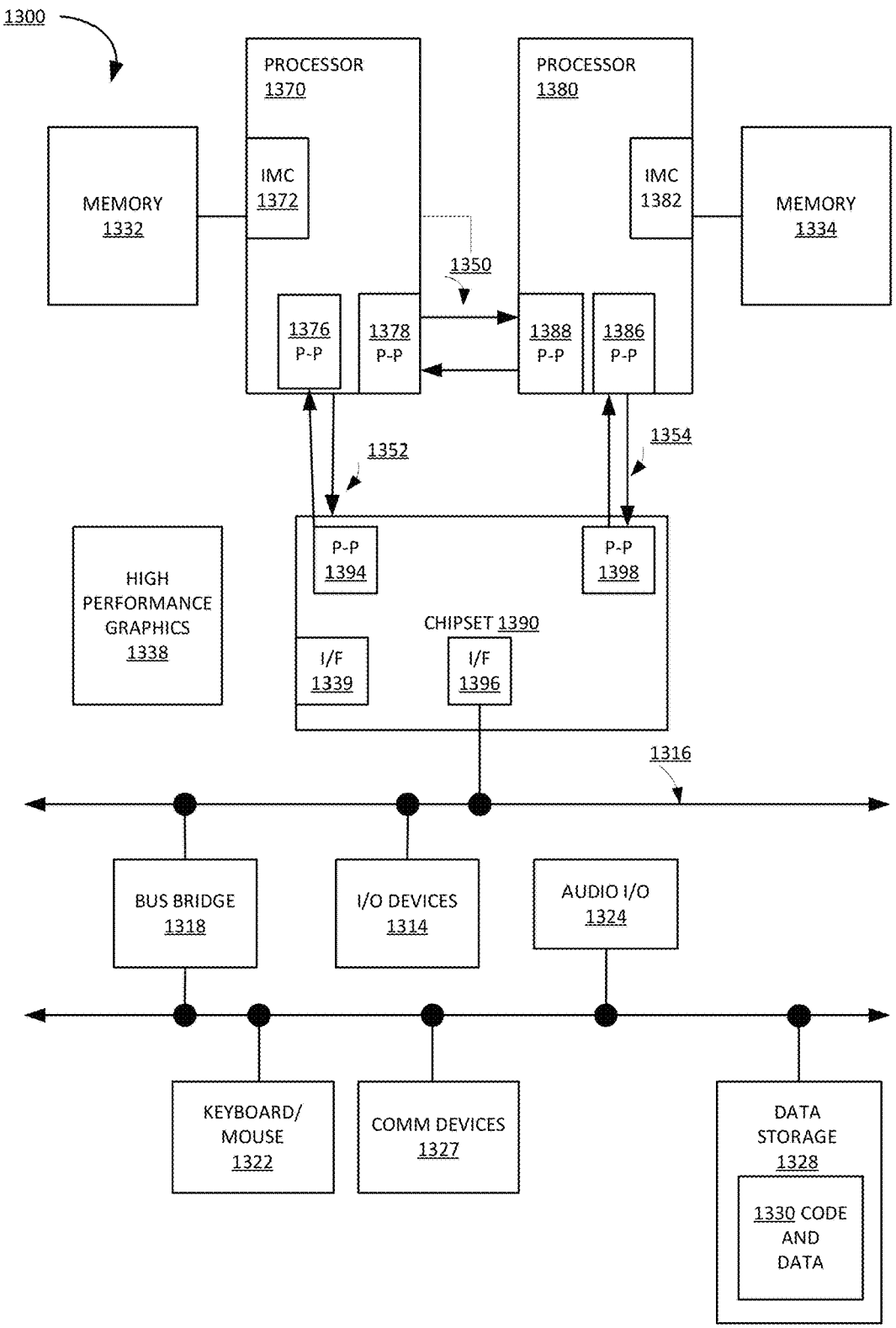
FIG. 13 is a block diagram of a System-on-a-Chip (SoC) in accordance with an implementation of the disclosure

Referring now to FIG. 13, shown is a block diagram of a system 1300 in accordance with an implementation of the disclosure. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of the processors of the computing systems as described herein. In one implementation, processors 1370, 1380 monitoring performance of a processing device to manage non-precise events to monitor performance of a processing device to manage non-precise events.

While shown with two processors 1370, 1380, it is to be understood that the scope of the disclosure is not so limited. In other implementations, one or more additional processors may be present in a given processor.

Processors 1370 and 1380 are shown including integrated memory controller units 1372 and 1382, respectively. Processor 1370 also includes as part of its bus controller units point-to-point (P-P) interfaces circuits 1376 and 1378; similarly, second processor 1380 includes P-P interface circuits 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370 and 1380 may each exchange information with a chipset 1390 via individual P-P interfaces 1352, 1354 using point to point interface circuits 1376, 1394, 1386, 1398. Chipset 1390 may also exchange information with a high-performance graphics circuit 1338 via a high-performance graphics interface 1339.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface. In one implementation, first bus 1316 may be a Peripheral Component Interconnect (PCI) bus, or a bus such as a PCI Express bus or another third generation I/O interconnect bus, although the scope of the disclosure is not so limited.

As shown in FIG. 13, various I/O devices 1314 may be coupled to first bus 1316, along with a bus bridge 1318, which couples first bus 1316 to a second bus 1320. In one implementation, second bus 1320 may be a low pin count (LPC) bus. Various devices may be coupled to second bus 1320 including, for example, a keyboard and/or mouse 1322, communication devices 1327 and a storage unit 1328 such as a disk drive or other mass storage device which may include instructions/code and data 1330, in one implementation. Further, an audio I/O 1324 may be coupled to second bus 1320. Note that other architectures are possible. For example, instead of the point-to-point architecture of FIG. 13, a system may implement a multi-drop bus or other such architecture.

Figure 14:
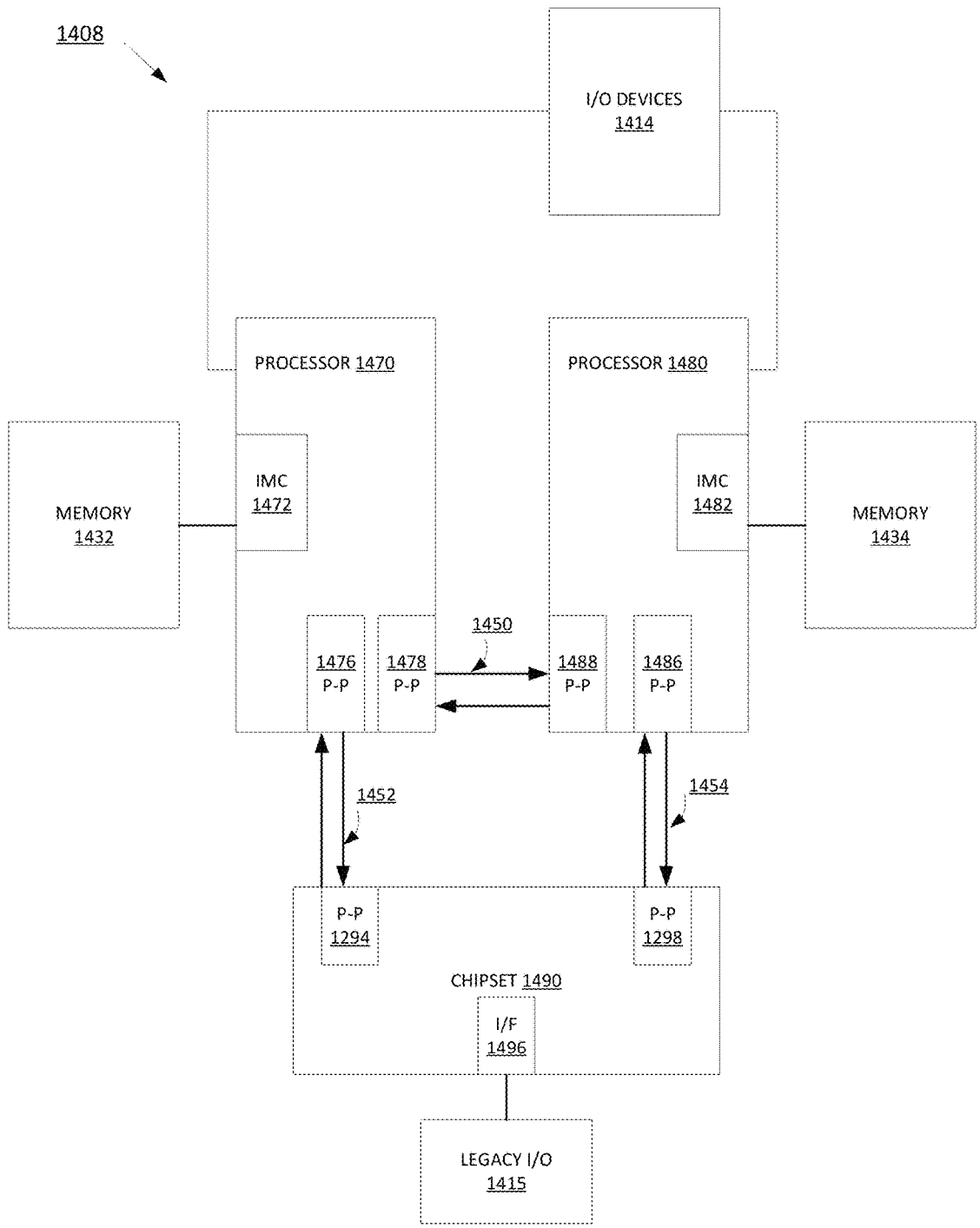
FIG. 14 is a block diagram of an implementation of a SoC design in accordance with the disclosure.

Referring now to FIG. 14, shown is a block diagram of a system 1400 in accordance with an implementation of the disclosure. FIG. 14 illustrates processors 1470, 1480. In one implementation, processors 1470, 1480 monitor performance of a processing device to manage non-precise events. Furthermore, processors 1470, 1480 may include integrated memory and I/O control logic ("CL") 1472 and 1482, respectively and intercommunicate with each other via point-to-point interconnect 1450 between point-to-point (P-P) interfaces 1478 and 1488 respectively. Processors 1470, 1480 each communicate with chipset 1490 via point-to-point interconnect 1452 and 1454 through the respective P-P interfaces 1476 to 1494 and 1486 to 1498 as shown. For at least one implementation, the CL 1472, 1482 may include integrated memory controller units. CLs 1472, 1482 may include I/O control logic. As depicted, memories 1432, 1434 coupled to CLs 1472, 1482 and I/O devices 1414 are also coupled to the control logic 1472, 1482. Legacy I/O devices 1415 are coupled to the chipset 1490 via interface 1496.

Figure 15:
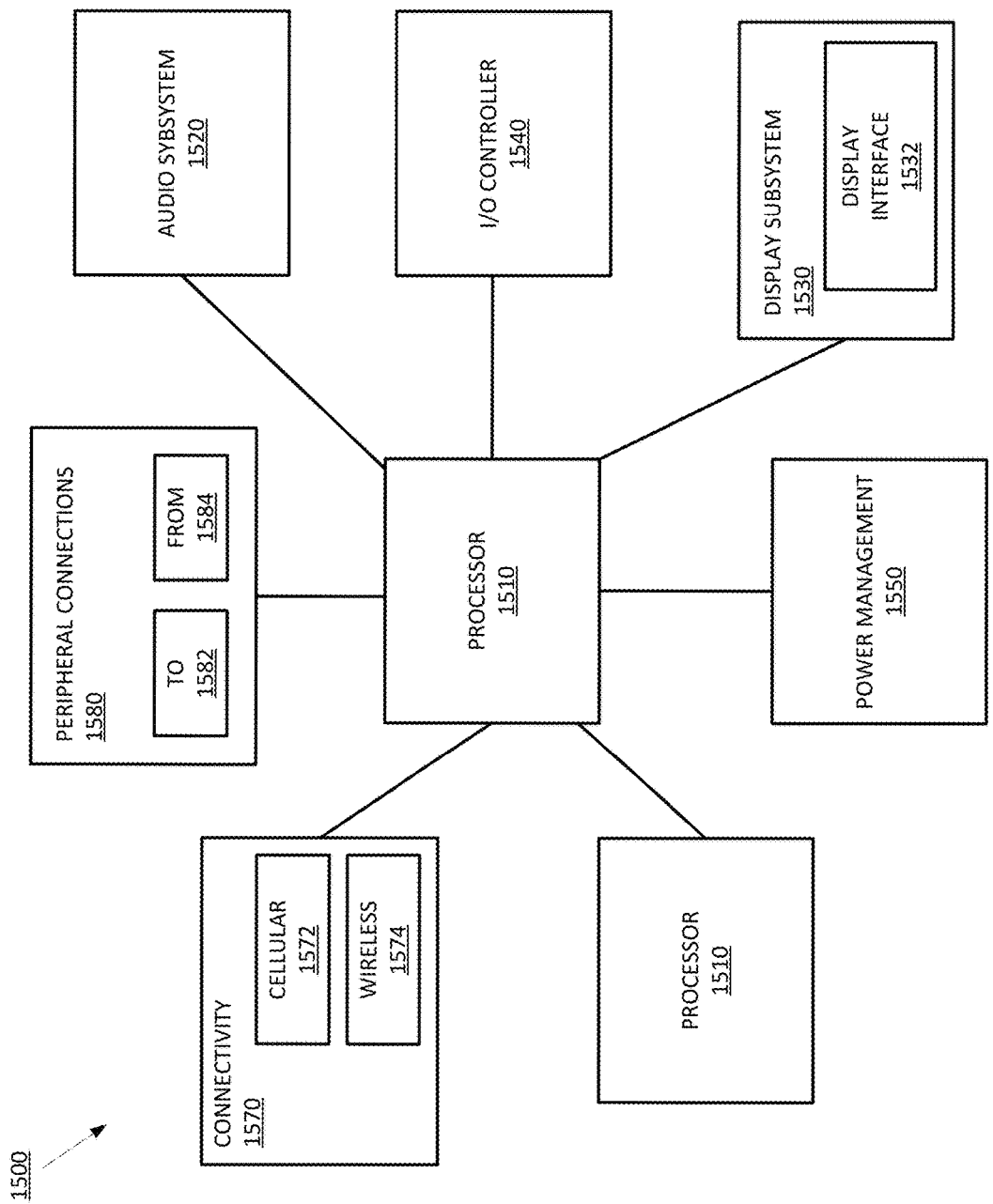
FIG. 15 illustrates a block diagram of one implementation of a computer system.

FIG. 15 illustrates a block diagram 1500 of an implementation of tablet computing device, a smartphone, or other mobile device in which touchscreen interface connectors may be used. Processor 1510 may monitor performance of a processing device to manage non-precise events. In addition, processor 1510 performs the primary processing operations. Audio subsystem 1520 represents hardware (e.g., audio hardware and audio circuits) and software (e.g., drivers, codecs) components associated with providing audio functions to the computing device. In one implementation, a user interacts with the tablet computing device or smartphone by providing audio commands that are received and processed by processor 1510.

Display subsystem 1530 represents hardware (e.g., display devices) and software (e.g., drivers) components that provide a visual and/or tactile display for a user to interact with the tablet computing device or smartphone. Display subsystem 1530 includes display interface 1532, which includes the particular screen or hardware device used to provide a display to a user. In one implementation, display subsystem 1530 includes a touchscreen device that provides both output and input to a user.

I/O controller 1540 represents hardware devices and software components related to interaction with a user. I/O controller 1540 can operate to manage hardware that is part of audio subsystem 1520 and/or display subsystem 1530. Additionally, I/O controller 1540 illustrates a connection point for additional devices that connect to the tablet computing device or smartphone through which a user might interact. In one implementation, I/O controller 1540 manages devices such as accelerometers, cameras, light sensors or other environmental sensors, or other hardware that can be included in the tablet computing device or smartphone. The input can be part of direct user interaction, as well as providing environmental input to the tablet computing device or smartphone.

In one implementation, the tablet computing device or smartphone includes power management 1550 that manages battery power usage, charging of the battery, and features related to power saving operation. Memory subsystem 1560 includes memory devices for storing information in the tablet computing device or smartphone. Connectivity 1570 includes hardware devices (e.g., wireless and/or wired connectors and communication hardware) and software components (e.g., drivers, protocol stacks) to the tablet computing device or smartphone to communicate with external devices. Cellular connectivity 1572 may include, for example, wireless carriers such as GSM (global system for mobile communications), CDMA (code division multiple access), TDM (time division multiplexing), or other cellular service standards). Wireless connectivity 1574 may include, for example, activity that is not cellular, such as personal area networks (e.g., Bluetooth), local area networks (e.g., WiFi), and/or wide area networks (e.g., WiMax), or other wireless communication.

Peripheral connections 1580 include hardware interfaces and connectors, as well as software components (e.g., drivers, protocol stacks) to make peripheral connections as a peripheral device ("to" 1582) to other computing devices, as well as have peripheral devices ("from" 1584) connected to the tablet computing device or smartphone, including, for example, a "docking" connector to connect with other computing devices. Peripheral connections 1580 include common or standards-based connectors, such as a Universal Serial Bus (USB) connector, DisplayPort including MiniDisplayPort (MDP), High Definition Multimedia Interface (HDMI), Firewire, etc.

Figure 16:
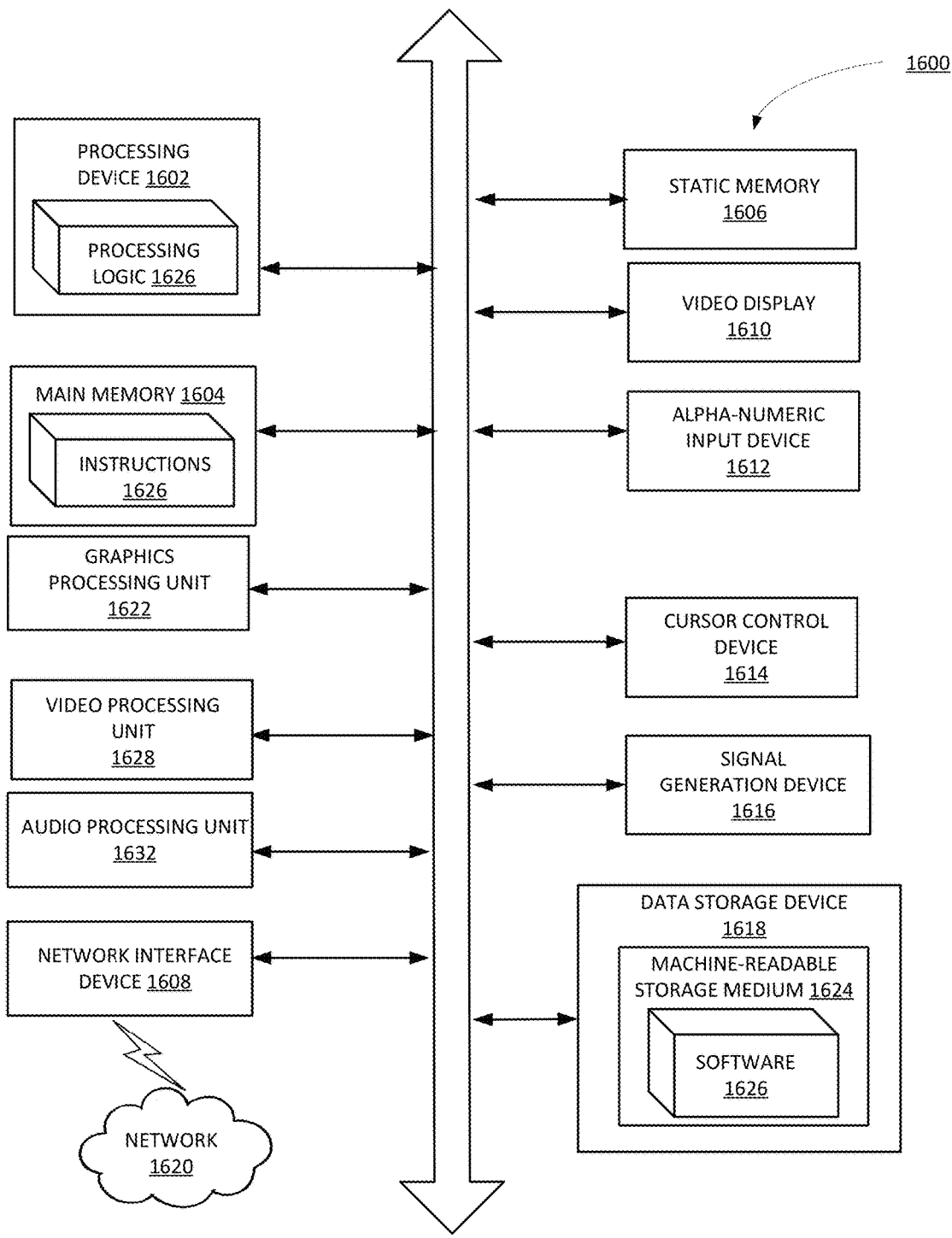
FIG. 16 illustrates a block diagram of a machine in form of a computing system in accordance with the disclosure.

FIG. 16 illustrates a diagrammatic representation of a machine in the example form of a computing system 1600 within which a set of instructions, for causing the machine to perform any one or more of the methodologies discussed herein, may be executed. In alternative implementations, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computing system 1600 includes a processing device 1602, a main memory 1604 (e.g., read-only memory (ROM), flash memory, dynamic random access memory (DRAM) (such as synchronous DRAM (SDRAM) or DRAM (RDRAM), etc.), a static memory 1606 (e.g., flash memory, static random access memory (SRAM), etc.), and a data storage device 1618, which communicate with each other via a bus 1630.

Processing device 1602 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1602 may also be one or more special-purpose processing devices such as an application specific integrated circuit (ASIC), a field programmable gate array (FPGA), a digital signal processor (DSP), network processor, or the like. In one implementation, processing device 1602 may include one or processing cores. The processing device 1602 is configured to execute the processing logic 1626 for performing the operations discussed herein. In one implementation, processing device 1602 is the same as computer systems 100 and 200 as described with respect to FIGS. 1A and/or FIG. 1B that implements the piecewise linear log approximation component 114 and piecewise linear anti-log approximation component 116. Alternatively, the computing system 1600 can include other components as described herein.

The computing system 1600 may further include a network interface device 1608 communicably coupled to a network 1620. The computing system 1600 also may include a video display unit 1610 (e.g., a liquid crystal display (LCD) or a cathode ray tube (CRT)), an alphanumeric input device 1612 (e.g., a keyboard), a cursor control device 1614 (e.g., a mouse), a signal generation device 1616 (e.g., a speaker), or other peripheral devices. Furthermore, computing system 1600 may include a graphics processing unit 1622, a video processing unit 1628 and an audio processing unit 1632. In another implementation, the computing system 1600 may include a chipset (not illustrated), which refers to a group of integrated circuits, or chips, that are designed to work with the processing device 1602 and controls communications between the processing device 1602 and external devices. For example, the chipset may be a set of chips on a motherboard that links the processing device 1602 to very high-speed devices, such as main memory 1604 and graphic controllers, as well as linking the processing device 1602 to lower-speed peripheral buses of peripherals, such as USB, PCI or ISA buses.

The data storage device 1618 may include a computer-readable storage medium 1624 on which is stored in software 1626 embodying any one or more of the methodologies of functions described herein. The software 1626 may also reside, completely or at least partially, within the main memory 1604 as instructions 1626 and/or within the processing device 1602 as processing logic 1626 during execution thereof by the computing system 1600; the main memory 1604 and the processing device 1602 also constituting computer-readable storage media.

The computer-readable storage medium 1624 may also be used to store instructions 1626 utilizing the piecewise linear log approximation component 114 and piecewise linear anti-log approximation component 116 as described with respect to FIG. 1A and/or FIG. 1B and/or a software library containing methods that call the above applications. While the computer-readable storage medium 1624 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the implementations. The term "computer-readable storage medium" shall accordingly be taken to include, but not be limited to, solid-state memories, and optical and magnetic media. While the disclosure has been described with respect to a limited number of implementations, those skilled in the art will appreciate numerous modifications and variations therefrom. It is intended that the appended claims cover all such modifications and variations as fall within the true spirit and scope of this disclosure.

The following examples pertain to further implementations.

Example 1 is a processor comprising a piece wise linear log approximation circuit to receive an input of a floating-point number comprising a sign, an exponent and a mantissa; approximate a fractional portion of a fixed point number using a linear approximation of the mantissa of the floating-point number; and derive an integer from the exponent.

In Example 2, the subject matter of Example 1 can optionally include wherein a value of the mantissa is between 0 and 1.

In Example 3, the subject matter of Examples 1-2 can optionally include wherein the piece wise linear log approximation circuit to generate an output representation of the fixed point number comprising the sign, the integer and the approximated fractional portion of the fixed point number.

In Example 4, the subject matter of Examples 1-3 can optionally include wherein the linear approximation of the floating-point number comprises a plurality of intervals, wherein each of the plurality of intervals corresponds to one of a plurality of linear equations.

In Example 5, the subject matter of Examples 1-4 can optionally include wherein the piece wise linear log approximation circuit to select an interval among the plurality of intervals based on a value of the mantissa of the floating-point number.

In Example 6, the subject matter of Examples 1-5 can optionally include wherein the piece wise linear log approximation circuit to approximate the fractional portion of the fixed point number using the corresponding linear equation at the selected interval.

In Example 7, the subject matter of Examples 1-6 can optionally include wherein the output representation of the fixed point number is generated for the selected interval.

Example 8 is a processor comprising a piece wise linear anti-log approximation circuit to receive an input of a fixed point number comprising a sign, an integer and a fractional portion of the fixed point number; approximate a fractional portion of a floating-point number using a linear approximation of the fractional portion of the fixed point number; and derive an exponent from the integer.

In Example 9, the subject matter of Example 8 can optionally wherein the fractional portion has a value between 0 and 1.

In Example 10, the subject matter of Examples 8-9 can optionally include wherein the piece wise linear anti-log approximation circuit to generate an output representation of the floating-point number comprising the sign, the exponent, and a mantissa representing the approximated fractional portion of the floating-point number.

In Example 11, the subject matter of Examples 8-10 can optionally include wherein the linear approximation of the fixed point number comprises a plurality of intervals, wherein each of the plurality of intervals corresponds to one of a plurality of linear equations.

In Example 12, the subject matter of Examples 8-11 can optionally include wherein the piece wise linear anti-log approximation circuit to select an interval among the plurality of intervals based on a value of the fractional portion of the fixed point number.

In Example 13, the subject matter of Examples 8-12 can optionally include wherein the piece wise linear anti-log approximation circuit to approximate the fractional portion of the floating-point number using the corresponding linear equation at the selected interval.

In Example 14, the subject matter of Examples 8-13 can optionally include wherein the output representation of the floating-point number is generated for the selected interval.

Example 15 is a hardware-implemented method comprising receiving an input of a floating-point number comprising a sign, an exponent and a mantissa; approximating a fraction al portion of a fixed point number using a linear approximation of the mantissa of the floating-point number; and deriving an integer from the exponent.

In Example 16, the subject matter of Example 15 can optionally include selecting an interval among a plurality of intervals based on a value of the mantissa of the floating-point number, wherein each of the plurality of intervals correspond to one of a plurality of linear equations.

In Example 17, the subject matter of Examples 15-16 can optionally include wherein the approximating comprising using the corresponding linear equation at the selected interval.

In Example 18, the subject matter of Examples 15-17 can optionally include generating an output representation of the fixed point number comprising the sign, the integer and a fractional portion of the fixed point number at the selected interval.

In Example 19, the subject matter of Examples 15-18 can optionally include wherein a value of the mantissa is between 0 and 1.

Example 20 is a non-transitory machine-readable storage medium including instructions that, when accessed by a processing device, cause the processing device to perform operations comprising receiving an input of a fixed point number comprising a sign, an integer, and a fractional portion of the fixed point number; approximating a fractional portion of a floating-point number using a the fractional portion of the fixed point number; and deriving an exponent from the integer.

In Example 21, the subject matter of Example 20 can optionally include selecting an interval among a plurality of intervals based on a value of the fractional portion of the fixed point number, wherein each of the plurality of intervals correspond to one of a plurality of linear equations.

In Example 22, the subject matter of Examples 20-21 can optionally include wherein the approximating comprising using the corresponding linear equation at the selected interval.

In Example 23, the subject matter of Examples 20-22 can optionally include generating an output representation of the floating-point number comprising the sign, the exponent and a mantissa representing the approximated fractional portion of the floating-point number for the selected interval.

In Example 24, the subject matter of Examples 20-22 can optionally include wherein the fractional portion has a value between 0 and 1.

Example 25 is an apparatus comprising means for receiving an input of a floating-point number comprising a sign, an exponent and a mantissa; means for approximating a fraction al portion of a fixed point number using a linear approximation of the mantissa of the floating-point number; and means for deriving an integer from the exponent.

In Example 26, the subject matter of Example 25 can optionally include to perform the method of any one of Examples 16 to 19.

Example 27 is at least one machine-readable medium comprising a plurality of instructions that in response to being executed on a computing device cause the computing device to carry out a method according to any one of Examples 15 to 19.

Example 28 is an apparatus for engine implementing piecewise linear approximation logarithmic operations for a processing device to perform the Examples 15 to 19.

Example 29 is an apparatus comprising means for performing the method of any one of Examples 15 to 19.

While the disclosure has been described with respect to a limited number of implementations, those skilled in the art will appreciate numerous modifications and variations there from. It is intended that the appended claims cover all such modifications and variations as fall within the true spirit and scope of this disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of implementations of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one implementation, refers to the hardware, which is specifically configured to recognize and/or execute the code to be held on a non-transitory medium. Furthermore, in another implementation, use of a module refers to the non-transitory medium including the code, which is specifically adapted to be executed by the microcontroller to perform predetermined operations. And as can be inferred, in yet another implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one implementation, use of the term logic includes hardware, such as transistors, registers, or other hardware, such as programmable logic devices.

Use of the phrase 'configured to,' in one implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one implementation, refers to some apparatus, logic, hardware, and/or element designed in such a way to enable use of the apparatus, logic, hardware, and/or element in a specified manner. Note as above that use of to, capable to, or operable to, in one implementation, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one implementation, a storage cell, such as a transistor or flash cell, may be capable of holding a single logical value or multiple logical values. However, other representations of values in computer systems have been used. For example the decimal number ten may also be represented as a binary value of 910 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one implementation, refer to a default and an updated value or state, respectively. For example, a default value potentially includes a high logical value, i.e. reset, while an updated value potentially includes a low logical value, i.e. set. Note that any combination of values may be utilized to represent any number of states.

The implementations of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform implementations of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the present disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation and other exemplarily language does not necessarily refer to the same implementation or the same example, but may refer to different and distinct implementations, as well as potentially the same implementation.

What is claimed is:

1. A processor comprising:
    a piecewise linear log approximation hardware circuit comprising:
        an input register to receive an input of a floating-point number comprising a sign, an exponent and a mantissa;
        a range selection circuit coupled to at least one multiplexor to approximate a fractional portion of a fixed point number using a linear approximation of the mantissa of the floating-point number;
        a subtractor circuit to derive an integer from the exponent; and
        an output register to store an output representation of the fixed point number comprising the sign, the derived integer, and the approximated fractional portion of the fixed point number, wherein the sign is passed directly to the output register from the input register.

2. The processor of claim 1, wherein a value of the mantissa is between 0 and 1.

3. The processor of claim 1, wherein the linear approximation of the floating-point number comprises a plurality of intervals, wherein each of the plurality of intervals corresponds to one of a plurality of linear equations.

4. The processor of claim 3 wherein the piecewise linear log approximation circuit to select an interval among the plurality of intervals based on a value of the mantissa of the floating-point number.

5. The processor of claim 4 wherein the piecewise linear log approximation circuit to approximate the fractional portion of the fixed point number using the corresponding linear equation at the selected interval.

6. The processor of claim 5 wherein the output representation of the fixed point number is generated for the selected interval.

7. A processor comprising:
a piecewise linear anti-log approximation hardware circuit comprising:
an input register to receive an input of a fixed point number comprising a sign, an integer and a fractional portion of the fixed point number;
range selection logic coupled to at least one multiplexor to approximate a fractional portion of a floating-point number using a linear approximation of the fractional portion of the fixed point number;
a subtractor circuit to derive an exponent from the integer; and
an output register to store an output representation of the floating-point number comprising the sign, the exponent, and a mantissa representing the approximated fractional portion of the floating-point number, wherein the sign is passed directly to the output register from the input register.

8. The processor of claim 7, wherein the fractional portion has a value between 0 and 1.

9. The processor of claim 7 wherein the linear approximation of the fixed point number comprises a plurality of intervals, wherein each of the plurality of intervals corresponds to one of a plurality of linear equations.

10. The processor of claim 9 wherein the piecewise linear anti-log approximation circuit to select an interval among the plurality of intervals based on a value of the fractional portion of the fixed point number.

11. The processor of claim 10 wherein the piecewise linear anti-log approximation circuit to approximate the fractional portion of the floating-point number using the corresponding linear equation at the selected interval.

12. The processor of claim 11 wherein the output representation of the floating-point number is generated for the selected interval.

13. A hardware-implemented method comprising:
receiving, by an input register of a piecewise linear log approximation hardware circuit, an input of a floating-point number comprising a sign, an exponent and a mantissa;
approximating, by range selection logic coupled to at least one multiplexor of the piecewise linear log approximation hardware circuit, a fractional portion of a fixed point number using a linear approximation of the mantissa of the floating-point number;
deriving, by a subtractor circuit of the piecewise linear log approximation hardware circuit, an integer from the exponent; and
outputting, to an output register of the piecewise linear log approximation hardware circuit, an output representation of the fixed point number comprising the sign, the derived integer, and the approximated fractional portion of the fixed point number, wherein the sign is passed directly to the output register from the input register.

14. The hardware-implemented method of claim 13 further comprising selecting an interval among a plurality of intervals based on a value of the mantissa of the floating-number, wherein each of the plurality of intervals correspond to one of a plurality of linear equations.

15. The hardware-implemented method of claim 14 wherein the approximating comprising using the corresponding linear equation at the selected interval.

16. The hardware-implemented method of claim 13 wherein a value of the mantissa is between 0 and 1.

17. A non-transitory machine-readable storage medium including instructions that, when accessed by a processing device, cause the processing device to perform operations comprising:
receiving, by an input register of a piecewise linear anti-log approximation hardware circuit of the processing device, an input of a fixed point number comprising a sign, an integer, and a fractional portion of the fixed point number;
approximating, by range selection logic coupled to at least one multiplexor of the piecewise linear anti-log approximation hardware circuit, a fractional portion of a floating-point number using a the fractional portion of the fixed point number;
deriving, by a subtractor circuit of the piecewise linear anti-log approximation hardware circuit, an exponent from the integer; and
outputting, to an output register of the piecewise linear anti-log approximation hardware circuit, an output representation of the floating-point number comprising the sign, the exponent, and a mantissa representing the approximated fractional portion of the floating-point number, wherein the sign is passed directly to the output register from the input register.

18. The non-transitory machine-readable storage medium of claim 17 further comprising selecting an interval among a plurality of intervals based on a value of the fractional portion of the fixed point number, wherein each of the plurality of intervals correspond to one of a plurality of linear equations.

19. The non-transitory machine-readable storage medium of claim 18 wherein the approximating comprising using the corresponding linear equation at the selected interval.

20. The non-transitory machine-readable storage medium of claim 17 wherein the fractional portion has a value between 0 and 1.

* * * * *